United States Patent
Morokuma et al.

(10) Patent No.: US 7,923,703 B2
(45) Date of Patent: Apr. 12, 2011

(54) SAMPLE DIMENSION INSPECTING/MEASURING METHOD AND SAMPLE DIMENSION INSPECTING/MEASURING APPARATUS

(75) Inventors: Hidetoshi Morokuma, Hitachinaka (JP); Akiyuki Sugiyama, Hitachinaka (JP); Ryoichi Matsuoka, Hitachinaka (JP); Takumichi Sutani, Hitachinaka (JP); Yasutaka Toyoda, Hitachi (JP)

(73) Assignee: Hitachi High-Technologies Corporation, Tokyo (JP)

( * ) Notice: Subject to any disclaimer, the term of this patent is extended or adjusted under 35 U.S.C. 154(b) by 312 days.

(21) Appl. No.: 12/279,564

(22) PCT Filed: Feb. 9, 2007

(86) PCT No.: PCT/JP2007/052795
§ 371 (c)(1),
(2), (4) Date: Nov. 18, 2008

(87) PCT Pub. No.: WO2007/094439
PCT Pub. Date: Aug. 23, 2007

(65) Prior Publication Data
US 2009/0218491 A1 Sep. 3, 2009

(30) Foreign Application Priority Data

Feb. 17, 2006 (JP) .................... 2006-040110

(51) Int. Cl.
*G01N 23/00* (2006.01)
*H01J 37/28* (2006.01)
*G21K 7/00* (2006.01)
(52) U.S. Cl. ................... 250/492.22; 250/307; 250/306; 250/310; 250/311; 250/492.2
(58) Field of Classification Search ............. 250/492.22, 250/306, 307, 310, 311, 492.2; 382/145, 382/149
See application file for complete search history.

(56) References Cited

U.S. PATENT DOCUMENTS

| 6,879,719 | B1 | 4/2005 | Conrad et al. |
| 7,365,322 | B2 | 4/2008 | Miyamoto et al. |
| 7,439,503 | B2 * | 10/2008 | Abe .............................. 250/310 |
| 7,679,055 | B2 * | 3/2010 | Sutani et al. .................. 250/307 |
| 7,732,792 | B2 * | 6/2010 | Matsuoka et al. ....... 250/492.22 |
| 2002/0158199 | A1 | 10/2002 | Takane et al. |

(Continued)

FOREIGN PATENT DOCUMENTS
JP 8-115959 5/1996

(Continued)

*Primary Examiner* — Nikita Wells
(74) *Attorney, Agent, or Firm* — McDermott Will & Emery LLP

(57) ABSTRACT

One of principal objects of the present invention is to provide a sample dimension measuring method for detecting the position of an edge of a two-dimensional pattern constantly with the same accuracy irrespective of the direction of the edge and a sample dimension measuring apparatus. According to this invention, to accomplish the above object, it is proposed to correct the change of a signal waveform of secondary electrons which depends on the direction of scanning of an electron beam relative to the direction of a pattern edge of an inspection objective pattern. It is proposed that when changing the scanning direction of the electron beam in compliance with the direction of a pattern to be measured, errors in the scanning direction and the scanning position are corrected. In this configuration, a sufficient accuracy of edge detection can be obtained irrespective of the scanning direction of the electron beam.

13 Claims, 23 Drawing Sheets

U.S. PATENT DOCUMENTS

| | | |
|---|---|---|
| 2004/0081350 A1 | 4/2004 | Kitamura et al. |
| 2005/0121610 A1 | 6/2005 | Abe |
| 2006/0193508 A1 | 8/2006 | Sutani et al. |
| 2008/0224035 A1* | 9/2008 | Sutani et al. .................. 250/306 |
| 2010/0140472 A1* | 6/2010 | Sutani et al. .................. 250/307 |

FOREIGN PATENT DOCUMENTS

| | | |
|---|---|---|
| JP | 2002-328015 | 11/2002 |
| JP | 2004-69416 | 3/2004 |
| JP | 2004-163420 | 6/2004 |
| JP | 2005-116795 | 4/2005 |

* cited by examiner (a)

(b)　　　(c)　　　(d)

(a)

(b)

(c)

(a)

(b)

($\Delta$X, $\Delta$Y)

REPEAT BY THE NUMBER OF EPE MEASUREMENTS

| EPE MEASUREMENT INFORMATION | | | | |
|---|---|---|---|---|
| EPE NUMBER | 1 | 2 | ... | n |
| EPE MEASUREMENT VALUE | 0.5 | -5.3 | | -12.4 |
| EPE MEASUREMENT DIRECTION | 270.0 | 270.0 | | 0.0 |
| CRITICAL DIMENSION EDGE X COORDINATES | 23950.0 | 24000.0 | | 13512.4 |
| CRITICAL DIMENSION EDGE Y COORDINATES | 19301.5 | 19294.7 | | 24510.0 |
| REFERENCE PATTERN CROSSING POINT X COORDINATES | 23950.0 | 24000.0 | | 13500.0 |
| REFERENCE PATTERN CROSSING POINT Y COORDINATES | 19300.0 | 19300.0 | | 24510.0 |
| REFERENCE PATTERN INFORMATION | | | | |
| KIND OF PATTERN | Design | Design | | Simulation |
| LAYER NUMBER | 10 | 10 | | 20 |
| DATA TYPE | 1 | 2 | | 5 |
| FIGURE NUMBER | 2 | 2 | | 15 |
| LINE SEGMENT NUMBER | 4 | 4 | | 259 |
| LINE SEGMENT STARTING POINT X COORDINATES | 23900 | 23900 | | 13500 |
| LINE SEGMENT STARTING POINT Y COORDINATES | 19300 | 19300 | | 23100 |
| LINE SEGMENT ENDING POINT X COORDINATES | 24100 | 24100 | | 13500 |
| LINE SEGMENT ENDING POINT Y COORDINATES | 19300 | 19300 | | 24500 |
| LINE SEGMENT DIRECTION | 0 | 0 | | 90 |
| EVALUATION RESULT | | | | |
| REFERENCE PATTERN SORTING | Line-1 | Line-2 | | Corner |
| MANAGING STANDARD UPPER LIMIT | 1.0 | 3.0 | | 5.0 |
| MANAGING STANDARD LOWER LIMIT | -1.0 | -3.0 | | -15.0 |
| DEGREE OF IMPORTANCE | 1 | 2 | | 1 |

92 — EPE MEASUREMENT INFORMATION
93 — REFERENCE PATTERN INFORMATION
94 — EVALUATION RESULT

SAMPLE DIMENSION INSPECTING/MEASURING METHOD AND SAMPLE DIMENSION INSPECTING/MEASURING APPARATUS

RELATED APPLICATIONS

This application is the U.S. National Phase under 35 U.S.C. §371 of International Application No. PCT/JP2007/052795, filed on Feb. 9, 2007, which in turn claims the benefit . of Japanese Application No. 2006-040110, filed on Feb. 17, 2006, the disclosures of which Applications are incorporated by reference herein.

TECHNICAL FIELD

The present invention relates to a pattern inspecting/measuring method, a pattern inspecting/measuring apparatus and a computer program for performing inspection/critical dimension of a pattern and more particularly, to a method and apparatus for inspecting/measuring the shape or placement error concerning a pattern by comparing design data of the pattern with an actual pattern.

BACKGROUND ART

It has been known to measure a circuit pattern of semiconductor device actually formed on a wafer by using a design data of the circuit pattern of semiconductor device. Since the design of the circuit pattern shows an ideal shape the circuit pattern of semiconductor device has primarily, the accuracy of patterning by a semiconductor fabrication process can be evaluated by comparing the design data with a pattern actually formed on the wafer.

Recently, fineness of a semiconductor integrated circuit has been advancing and in the wake thereof, the performance of a semiconductor inspecting apparatus has been ameliorated. As one of the semiconductor inspecting apparatus as above, a CD-SEM (Critical Dimension Scanning Electron Microscope) is available. The CD-SEM is an apparatus in which the dimension of a pattern formed on a sample is measured on the basis of secondary electrons obtained by scanning an electron beam, a kind of charged-particle beam, on the sample.

Patent Document 1 discloses that an amount of deformation of a pattern is detected by detecting a pattern edge of an inspection objective pattern with the help of the CD-SEM and by comparing it with a reference pattern.

Secondary electrons obtained by scanning the electron beam on the sample sometimes differ in generation intensity and in distribution of generated secondary electrons depending on the direction of scanning of the electron beam and on the direction of a pattern edge of the inspection objective pattern. Patent Document 1 and Patent Document 2 propose that in order to mitigate the above inconvenience, the electron beam is constantly scanned vertically to the direction of an edge of the pattern to be measured.
[Patent Document 1] JP-A-2004-163420
[Patent Document 2] JP-A-2005-116795

DISCLOSURE OF THE INVENTION

In some of up-to-date semiconductor integrated circuits, the fineness so advances as to make the pattern width amount to less than 32 nm. In order to control the pattern dimension as above, the pattern shape needs to be measured with an accuracy of sub-nanometer of 0.3 nm~0.2 nm or less. To realize such a measurement accuracy, the differences in secondary electron generation intensity and distribution as well attributable to the differences in the electron beam scanning direction and in pattern edge direction cannot be neglected.

Therefore, the Patent Document 1 and Patent Document 2 propose that the electron beam is always scanned vertically to the direction of the pattern edge of inspection objective pattern but they raise problems as below.

The accuracy of control of scanning position and direction of the electron beam is limited and in some case, when the scanning direction is changed, the pattern edge detection position will change by 1 nm or more. Accordingly, with the electron beam managed to scan constantly vertically to the pattern edge of inspection objective pattern, an error will take place in pattern edge detection position depending on the scanning position and direction. The Patent Document 2 discloses a method of combining SEM images subject to different scanning directions but in-plane distortions of an SEM image differ with scanning direction and hence, all patterns within a field of view of the SEM image cannot be superposed with sufficiently high accuracies.

The techniques disclosed in the Patent Documents 1 and 2, however, did not take countermeasures against errors in control of the scanning direction and position caused by changing the scanning direction and position of the electron beam as above.

According to the present invention, to accomplish the above object, differences in generation intensity and distribution of secondary electrons attributable to differences in the scanning direction of an electron beam and the pattern edge direction as well are investigated in advance and put to a library and an actually acquired secondary electron signal is corrected by using the library, whereby the edge position of even a pattern edge not vertical to the scanning direction of the electron beam can be measured accurately.

Further, by measuring a scanning error depending on the scanning position and direction of an electron beam in advance and superposing the error on a control signal during scanning of the electron beam, errors caused when the scanning direction and position of the electron beam are changed can be reduced and a pattern edge position can be measured sufficiently accurately.

The principal advantage of the present invention is to provide sample dimension inspecting/measuring method and apparatus in which by reducing the error of measurement of a pattern edge position attributable to differences in the electron beam scanning direction and the pattern edge direction as well and by reducing the error of measurement of a pattern edge position due to errors of the scanning position and direction caused when the scanning direction of the electron beam is changed, edge positions in all directions of a fine pattern can be measured with high accuracies.

BRIEF DESCRIPTION OF THE DRAWINGS

FIG. 23 is a diagram showing an example of results of output of the EPE measurement result.

BEST MODE FOR CARRYING OUT THE INVENTION

Figure 1:
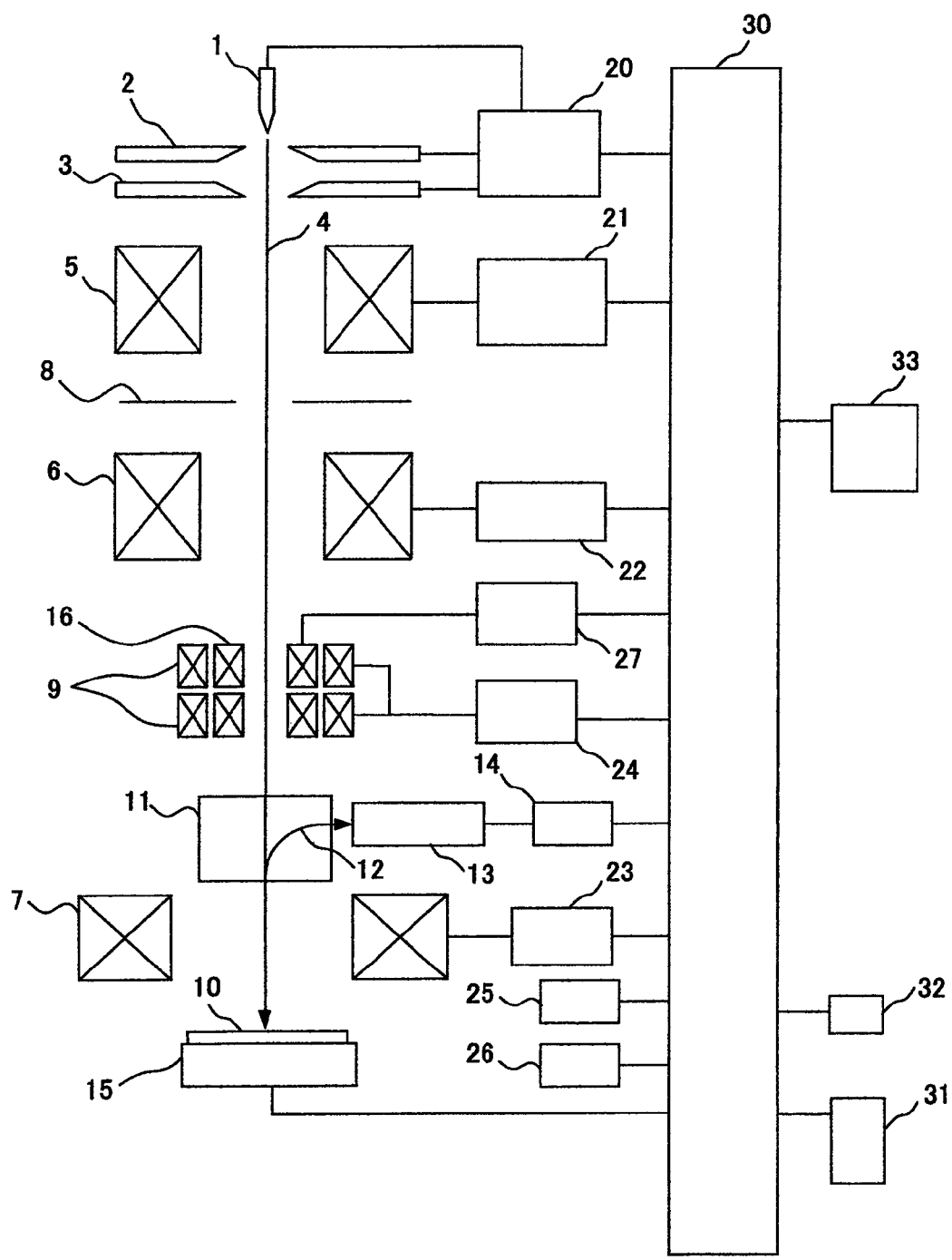
FIG. 1 is a diagram for explaining the outline of a scanning electron microscope.

The outline of a scanning electron microscope (hereinafter referred to as SEM) will be described hereunder by using FIG. 1. A voltage is applied across a cathode 1 and a first anode 2 by means of a high voltage control power supply 20 controlled by a control processor 30 and a primary electron beam 4 is extracted at a predetermined emission current from the cathode 1. Across the cathode 1 and a second anode 3, an accelerating voltage is applied by means of the high voltage control power supply 20 controlled by the control processor 30 and the primary electron beam 4 emitted from the cathode 1 is accelerated to proceed to a subsequent stage of lens system.

The primary electron beam 4 is converged by a convergent lens 5 controlled in current by means of a lens control power supply 21 controlled by the control processor 30, is removed of its unwanted region by an aperture plate 8 and is then focused to a fine spot on a sample 10 with the help of a focusing lens 6 controlled in current by means of a lens control power supply 22 controlled by control processor 30 and an objective lens 7 controlled in current by means of an objective lens control power supply 23 controlled by the control processor 30. The objective lens 7 can take any of various types of in-lens, out-lens and Schnorchel type (semi-in-lens type).

The retarding type of decelerating the primary electron beam by applying a negative voltage to the sample 10 may be employable. Further, each of the lenses may also be constructed of an electrostatic type lens having a plurality of electrodes applied with controlled voltages.

The primary electron beam 4 is scanned two-dimensionally on the sample 10 with the help of a scanning coil 9 controlled in current by means of a scanning coil control power supply 24 controlled by the control processor 30. A secondary signal 12 of, for example, secondary electrons generated from the sample 10 under irradiation of the primary electron beam proceeds to above the objective lens 7 and thereafter separated from the primary electrons by means of an orthogonal electromagnetic field generation unit 11 for secondary signal separation so as to be detected by a secondary signal detector 13. The signal detected by the secondary signal detector 13 is amplified by a signal amplifier 14 and then transferred to an image memory 25 and displayed as a sample image on an image display unit 26.

Two stages of deflection coils (aligner for objective lens) 16, which are controlled in current by means of an aligner control power supply 27 for objective lens controlled by the control processor 30, are arranged at the same position as the scanning coil 9 and the position along which the primary electrons 4 pass through the objective lens 7 can be controlled two-dimensionally. A stage 15 can move the sample 10 in at least two directions (X direction, Y direction) in a plane vertical to the primary electron beam, thereby ensuring that the scanning area of primary electrons 4 on the sample 10 can be changed.

A pointing unit 31 can designate the position of a sample image displayed on the image display unit 26 to enable information of the sample image to be acquired. An input unit 32 can designate conditions of fetching of the image (scanning speed, number of accumulative images) and view field correction method and besides can designate delivery and storage of images.

Address signals corresponding to memory positions of an image memory are generated in the control processor 30 or in a control computer 42 arranged separately, are subjected to analog conversion and are then supplied to the scanning coil control power supply 24. When the image memory has, for example, 512×512 pixels, the address signal in X direction is a digital signal repeating 0 to 512 and the address signal in Y direction is a digital signal repeating 0 to 512 which advances by plus 1 each time that the address signal in X direction starting from 0 reaches 512. These signals are converted into analog signals.

The address of image memory 25 corresponds to the address of a deflection signal for scanning the electron beam and therefore, a two-dimensional image in an area of deflection of electron beam by means of the scanning coil 9 is recorded in the image memory. The signals inside the image memory 25 can be read out sequentially on time series basis by means of a read address generation circuit synchronized with a readout clock. A signal read out in correspondence with an address is converted into an analog signal that acts as a brightness modulation signal of the image display unit 26.

The apparatus explained in the present example, has the function to form a line profile on the basis of detected secondary electrons or backscattering electrons. The line profile is formed on the basis of an amount of detected electrons or brightness information obtained when the primary electron beam 4 is scanned linearly or two-dimensionally on the sample 10 and the thus obtained line profile is used for dimension measurement and the like of, for example, a pattern formed on a semiconductor wafer.

The control processor 30 is described in connection with FIG. 1 as being integral or so with the scanning electron microscope but this is in no way limitative and the process may be conducted with a processor provided separately from the scanning electron microscope column. In such a case, it is necessary that the detection signal detected by the secondary signal detector 13 be transmitted as an image to the control processor 30 and besides, a transmission medium for transmission of signals from the control processor 30 to the objective lens control power supply 23 and scanning coil control power supply 24 of the scanning electron microscope and an input/output terminal for input/output of the signals transmitted via the transmission medium be provided.

Further, the present apparatus has the function to store in advance conditions for observation of, for example, plural points on the semiconductor wafer (measuring locations, optical conditions of scanning electron microscope and so on) as a recipe and conduct measurement and observation in accordance with the contents of the recipe. The control processor 30 also functions as an arithmetic unit during measurement of pattern dimensions.

Also, a program for execution of a process to be described below may be registered in a memory medium and the program may be executed by a processor for supplying necessary signals to the scanning electron microscope and so on. Namely, an example to be explained below will be described by way of example of a program or a program product adoptable to a charged-particle beam apparatus capable of acquiring images such as the scanning electron microscope.

Further, the control processor 30 may be connected with a design data management unit 33 adapted to store circuit pattern design data of semiconductor device expressed in a GDSII format or OASIS format and convert the design data into data necessary for control of the SEM. The design management unit 33 has the function to prepare a recipe for controlling the SEM on the basis of inputted design data. It also has the function to work the design data on the basis of a signal transmitted from the control processor 30. Further, a process to be described below may be executed by means of a processor provided in the design data management unit 33. Moreover, the scanning electron microscope may be controlled with a processor that is provided in the design management unit 33 to substitute for the control processor 30.

In describing the present example, the design data management unit 33 will be described as being separate from the control processor 30 but this is not limitative and it may be integral with the control processor.

Used as the sample 10 in the present example is a wafer on an excursion of fabrication of a semiconductor product. A resist pattern formed on the wafer through lithography process is used. As a comparative object, design data of a circuit pattern of semiconductor device from which the pattern originates is used.

The design data of a circuit pattern of semiconductor device used herein indicates an ideal pattern when the semiconductor device circuit is formed on the wafer ultimately. In the following description, the inspection objective is the semiconductor wafer but this is not limitative so long as the design data and an object desired for evaluation are paired. For example, the following description is valid for a mask pattern formed on glass substrate used when exposure of a semiconductor pattern on a wafer is executed or for a pattern formed on a glass substrate such as a liquid crystal panel.

The kind of design data of circuit pattern does not matter if the software for displaying the design data of circuit pattern can display its format form and can handle it as graphical data.

With reference to the accompanying drawings, an example of measurement of an error in shape (hereinafter sometimes referred to as EPE (Edge Placement Error) measurement) between an edge portion of a pattern shown in an image acquired by an electron microscope (hereinafter sometimes referred to as SEM edge) and a pattern shape shown in design data (hereinafter sometimes referred to as design pattern) will be described.

Embodiment 1

Figure 2:
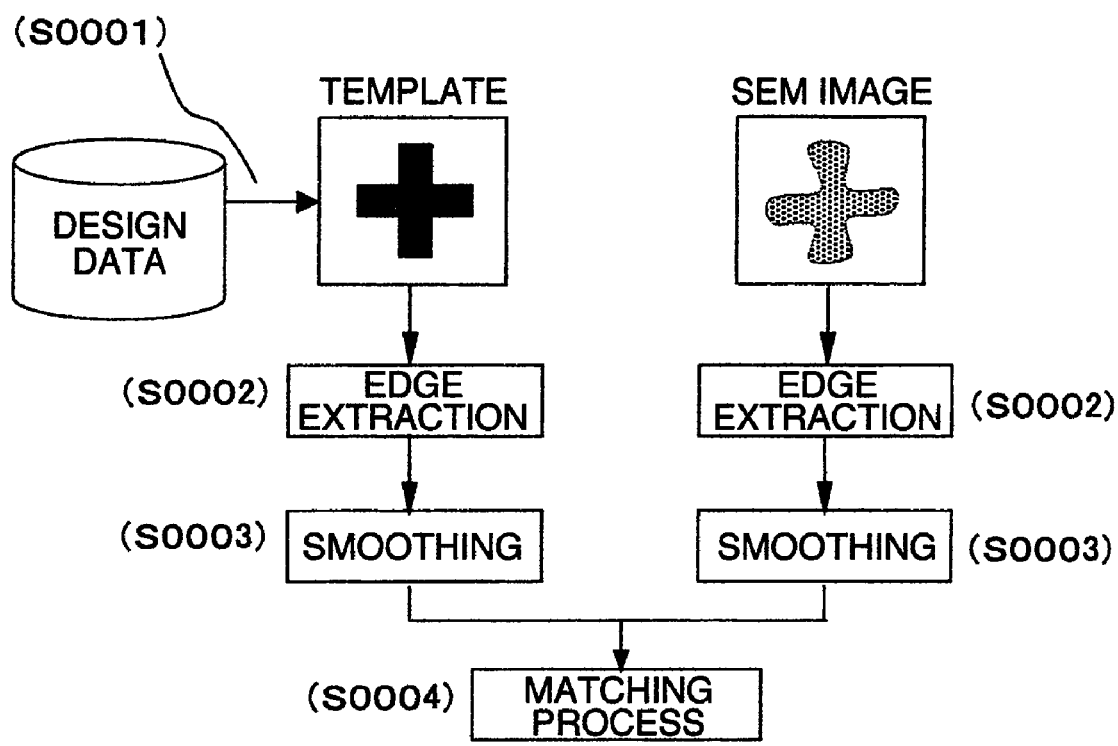
FIG. 2 is a diagram for explaining a matching process of design data and an SEM image.
Figure 3:
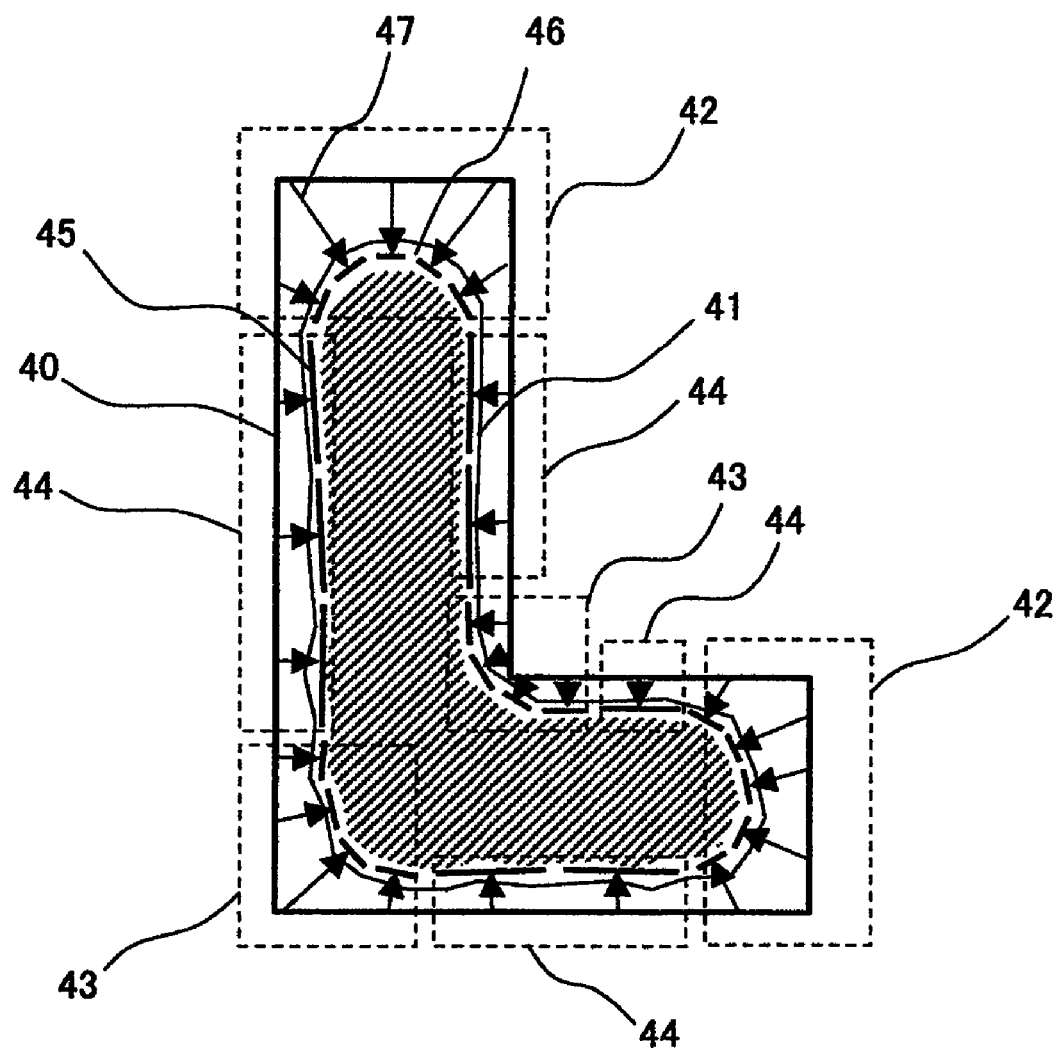
FIG. 3 is a diagram for explaining an EPE measurement referenced to SEM edges.

FIG. 3 illustrates a state in which an electron microscope image of an actual pattern 41 formed on a wafer (hereinafter referred sometimes to as an actual pattern) is superposed on a design pattern 40. This can be obtained by subjecting each of a binary-digitized template prepared from the design pattern 40 (S0001) and an SEM image actually acquired from the wafer to edge extraction (S0002) and smoothing (S0003) and then by subjecting them to a matching process (S0004) through the use of a normalizing function, as shown in FIG. 2.

The EPE measurement is to measure an error in shape between the ideal pattern shape indicated by the design pattern 40 and the actual pattern 41 but as will be described with reference to FIG. 3, the actual pattern 41 is often formed while being constricted at a pattern tip portion 42 and rounded at a corner portion 43, for example. In an example as shown in FIG. 3, the pattern is sorted into 1) a tip portion of pattern (hereinafter referred to as tip portion 42), 2) a linear portion of pattern (hereinafter referred to as linear portion 44) and 3) a corner of pattern (hereinafter referred to as corner portion 43).

The reason why this division is taken is that the tendency toward deformation and the amount of deformation will change with features of the pattern shape. The two-dimensional shape measurement is exactly to measure the whole of a pattern shape which changes variously in accordance with the features of the pattern shape.

FIG. 3 is a diagram for explaining an instance where the EPE measurement 47 is carried out at all positions of SEM edges 45 detected from an SEM image but when the electron beam is scanned in a fixed direction, pattern edge positions cannot be measured with sub-nanometer precision in all directions because of the relation the direction of a pattern edge of the actual pattern 41 has to the scanning direction.

Figure 4:
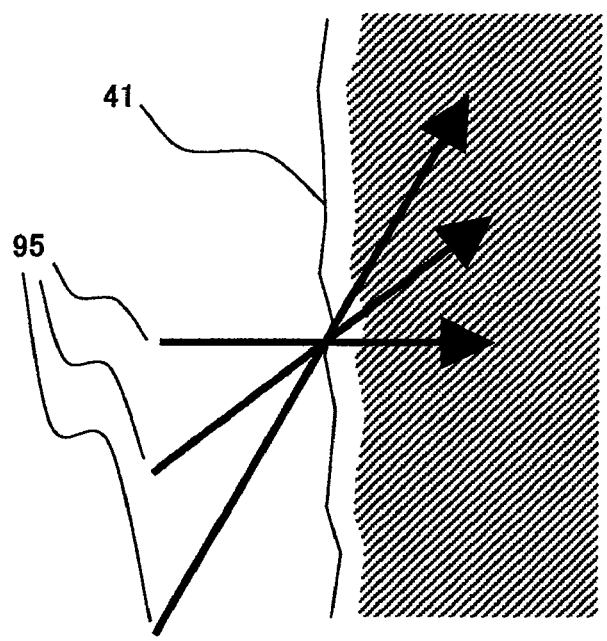
FIG. 4 is a diagram showing differences in secondary electron signal waveform due to scanning directions of an electron beam which are different in relation to the direction of a pattern edge of actual pattern.
Figure 4:
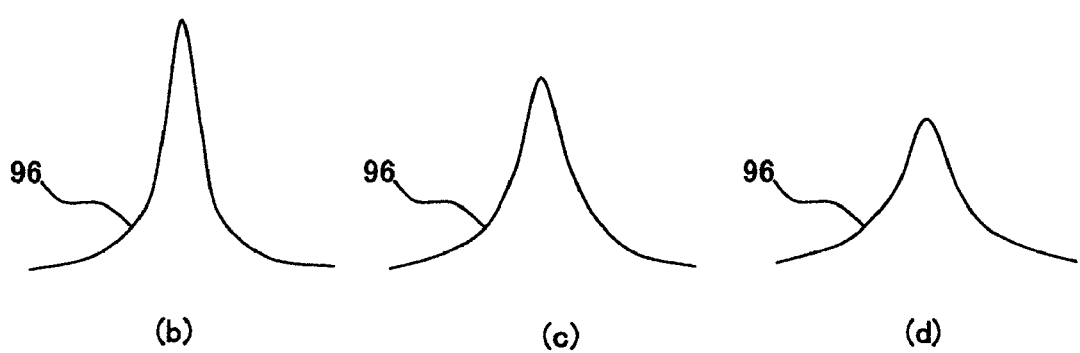

Specifically, depending on different electron beam scanning directions 95 in relation to the direction of an edge of the actual pattern 41 on the wafer as shown in FIG. 4, different signal waveforms 96 of generated secondary electrons develop. Illustrated at (b) in FIG. 4 is a signal waveform of secondary electrons when the electron beam is scanned vertically to the edge of actual pattern 41 on the wafer, at (c) is a signal waveform of secondary electrons when scanning is in, for example, 45° direction and at (d) is a signal waveform of secondary electrons when scanning is in, for example, 30° direction.

Figure 5:
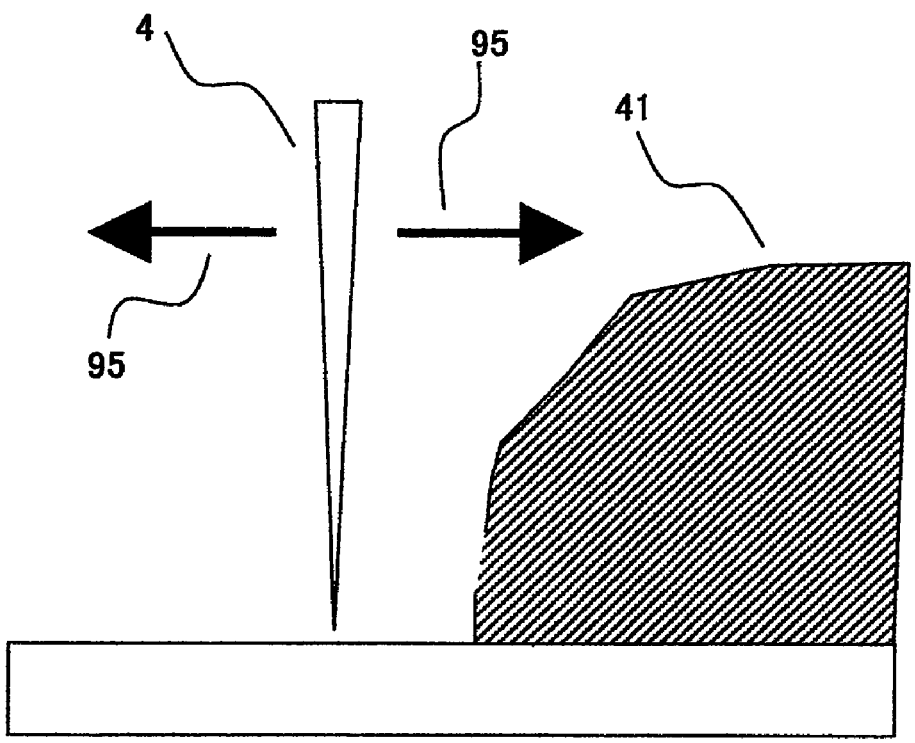
FIG. 5 is a diagram showing differences in secondary electron signal waveform due to electron beam scanning directions which are different with differences in the height of a pattern edge.
Figure 5:
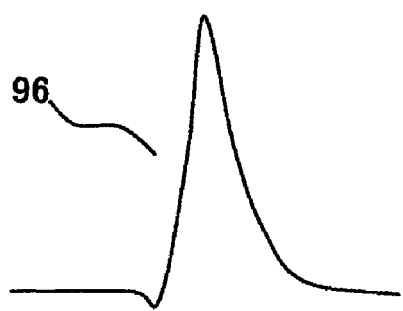
Figure 5:

Further, the generation intensity and generation distribution of secondary electrons sometimes differ, as shown in FIG. 5, for the case where the electron beam (primary electron beam 4) is scanned from the outside (low intensity location) of actual pattern 41 to the inside (high intensity location) and for the case where the electron beam is scanned from the inside (high intensity location) to the outside (low intensity location). Illustrated at (b) in FIG. 5 is the instance where the electron beam is scanned from the outside (low intensity location) of actual pattern 41 on the wafer to the inside (high intensity location) and at (c) in FIG. 5 is the instance where the electron beam is scanned from the inside (high intensity location) of actual pattern 41 on the wafer to the outside (low intensity location).

Figure 6:
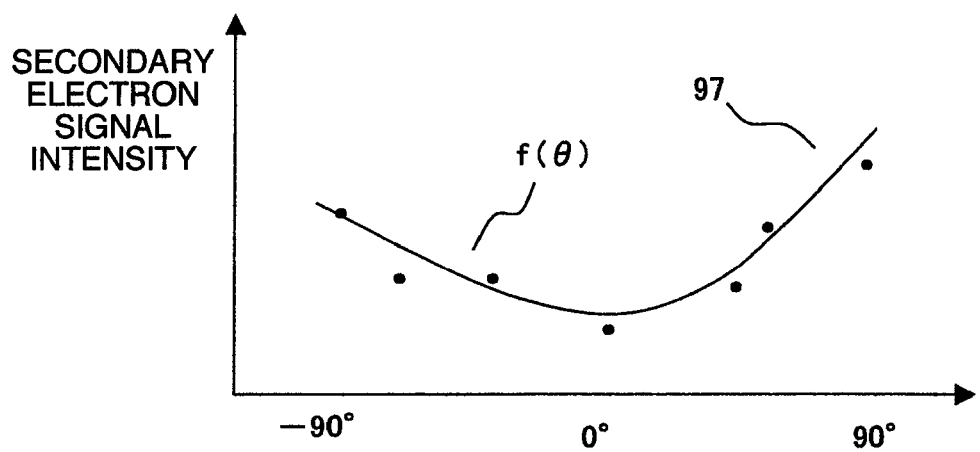
FIG. 6 shows diagrams showing what tendency the signal intensity and signal waveform half-width of secondary electrons have toward the electron beam scanning direction.
Figure 6:
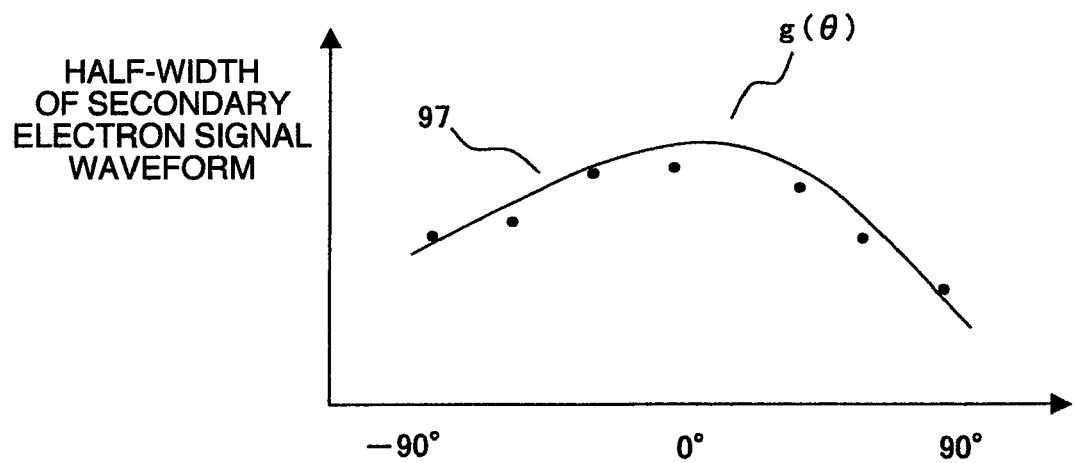

The differences in secondary electron signal waveforms have, as shown in FIG. 6, constant tendencies which depend on an angle the electron beam scanning direction makes to an actual pattern on the wafer. In the figure, 90° corresponds to the case where the electron beam is scanned from the outside (low intensity location) of actual pattern 41 on the wafer to the inside (high intensity location), 0° corresponds to the case where the electron beam is scanned horizontally to the edge of actual pattern 41 on the wafer and −90° corresponds to the case where the electron beam is scanned from the inside (high intensity location) of actual pattern 41 on the wafer to the outside (low intensity location).

By using a dosage curve 97 of the intensity of secondary electrons and a dosage curve 97 of the half-width of the signal which are determined from graphs shown in FIG. 6, the signal waveform of secondary electrons at a desired angle can be corrected. For example, pursuant to equation (1), the signal intensity of secondary electrons can be corrected and pursuant to equation (2), the half-width of secondary electron signal waveform can be corrected.

(signal intensity after correction)=(original signal intensity)×$f(\theta)$     (1)

(half-width after correction)=(original width)×$g(\theta)$     (2)

Embodiment 2

Figure 7:
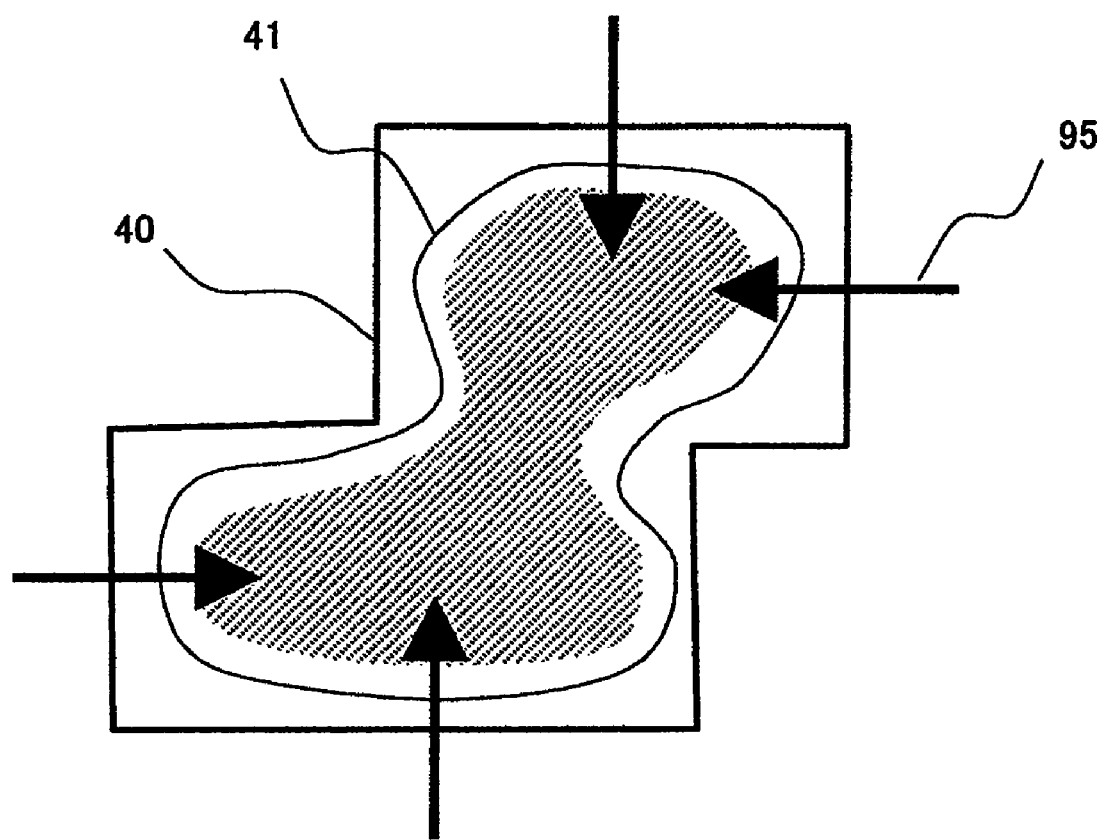
FIG. 7 is a diagram showing a method of scanning the electron beam vertically to pattern edges in all directions.
Figure 8:
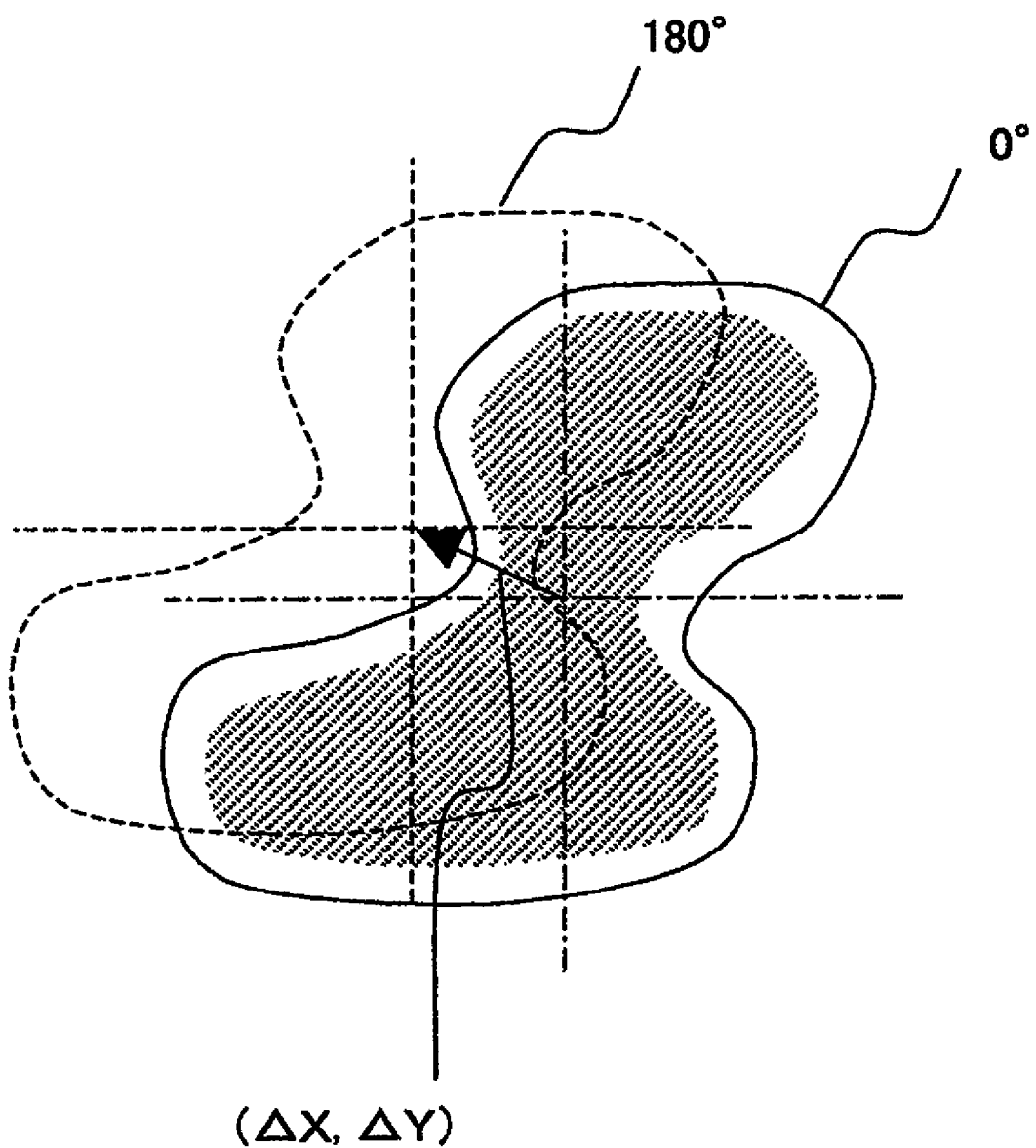
FIG. 8 is a diagram showing a positional error when the scanning direction of the electron beam is changed.

In FIG. 7, a method of switching the scanning direction 95 of the electron beam in compliance with the EPE measurement direction. By using this method, identical signal waveforms of secondary electrons can be obtained even in respect of pattern edges in any directions. But, when the scanning direction of electron beam is changed as described previously, the scanning position will sometimes displace as shown in FIG. 8. In this example, the actual pattern 41 on SEM image when the electron beam scanning direction is 0° is indicated in solid curve, the actual pattern in the case of 180° is indicated in dotted curve and an error in the electron beam scanning direction between 0° and 180° directions is indicated by ($\Delta X$, $\Delta Y$).

Figure 9:
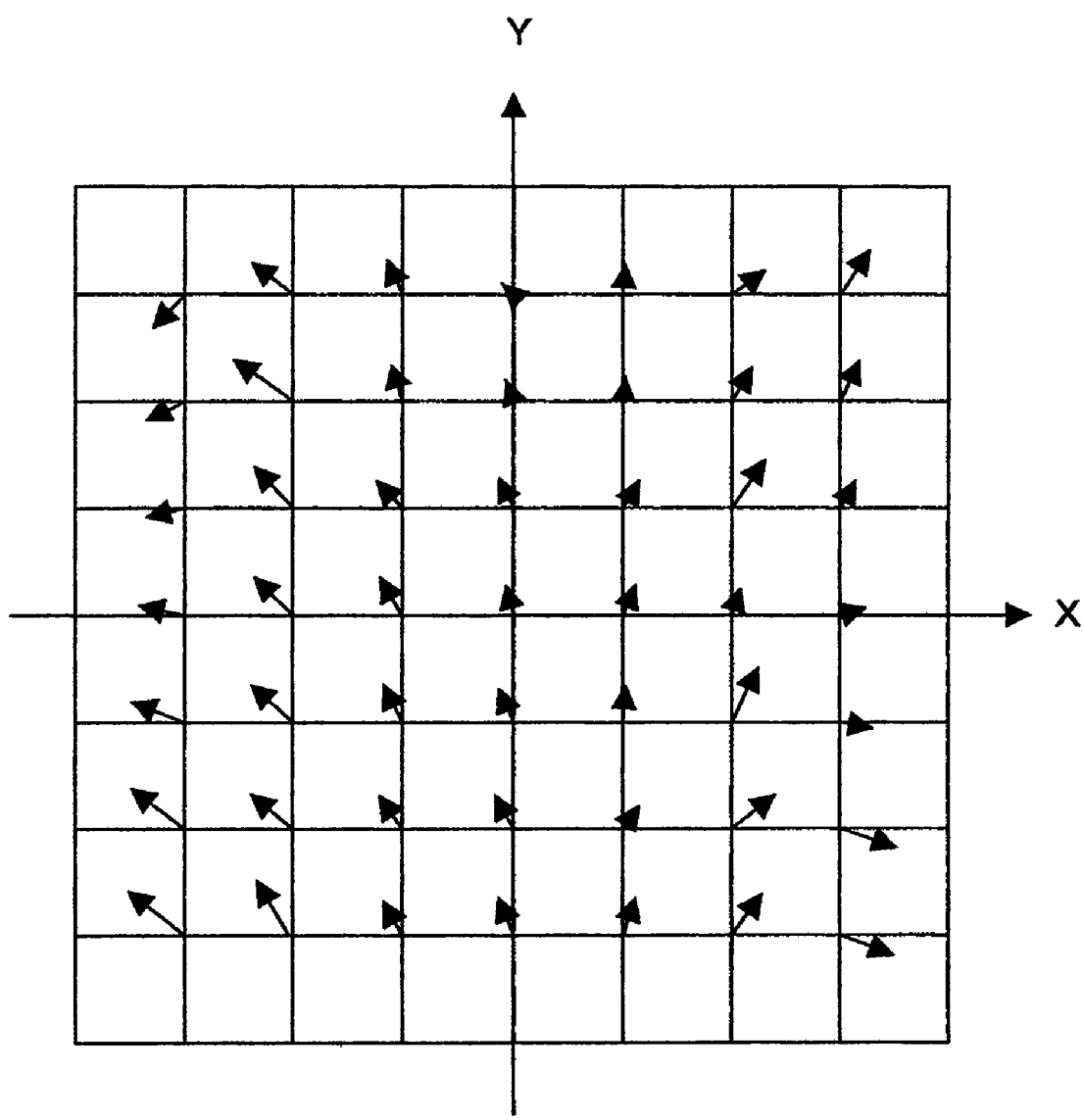
FIG. 9 is a diagram showing errors in scanning positions at individual scanning positions of the electron beam.

While in this example only errors in X direction and Y direction are indicated, an error in rotational direction will possibly occur. Further, there is the possibility that these errors will differ with the distance or direction of the electron beam scanning position from the center axis of electron optical system. Accordingly, as shown in FIG. 9, errors in the scanning position and direction of the electron beam are measured in advance and by using the results, the control signal for the electron beam scan is corrected or after the scanning position and direction of the electron beam illustrated in FIG. 7 are corrected to correct (actual) position and direction, the pattern edge position is measured. It will be appreciated that a measure in FIG. 9 indicates a position of the electron beam from the center of electron optical system and an arrow shows an error in the electron beam scanning position at a position of interest.

Embodiment 3

Figure 10:
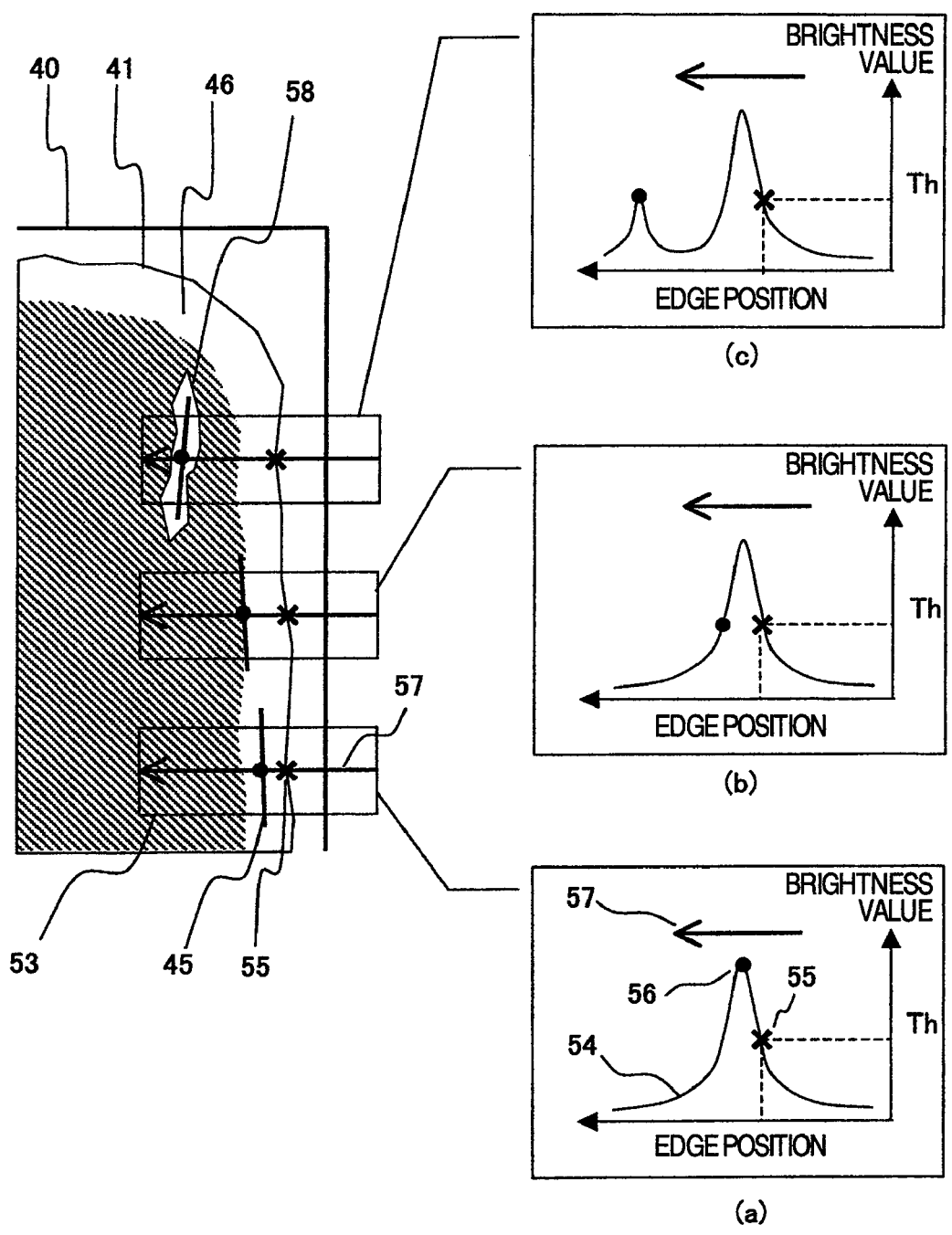
FIG. 10 is a diagram for explaining a process of extracting critical dimension edges by using a line profile referenced to an SEM edge.

An example of measuring a pattern edge position by using secondary electron signal waveforms obtained through scanning of (one) electron beam at one position is shown in FIG. 4 but this is disadvantageous in that the S/N ratio of signal waveform is low and the accuracy of EPE measurement is insufficient. To the contrary, a method as shown in FIG. 10 is employable according to which by using a line profile 54 created by averaging and smoothing a plurality of secondary electron signal waveforms obtained through scanning of (plural) electron beams at plural positions, the pattern edge position is measured. Since the line profile 54 has a higher S/N than every one original secondary electron signal waveform, a correct pattern edge position can be measured accurately.

By using the method as above, a correct contour of the actual pattern 41 can be detected with sub-nanometer accuracies.

The line profile can be prepared 1) by extracting pieces of information of pixels inside an area of critical dimension box 53 (gradation information in gray scale) from image data of an SEM image of an inspection objective pattern and accumulating (averaging) and smoothing the information pieces in an edge search direction 57 or 2) by scanning an inspection objective area of critical dimension box 53 plural times with the electron beam in directions horizontal to the edge search direction 57 to obtain secondary electron signal waveforms and accumulating (averaging) and smoothing them.

In FIG. 10, a constant threshold Th is set to the brightness value of line profile 54 and a position where the line profile 54 crosses the threshold Th is determined as a critical dimension edge 55 but putting this method aside, there are various methods for edge detection from the line profile 54 and this method is not limitative. In FIG. 10, the critical dimension box 53 is centered on a middle point 56 of SEM edge 45 so as to lie in a direction orthogonal to the design pattern 40 but this is not limitative as is clear from a description given with reference to FIG. 13.

A process flow will be described specifically with reference to FIG. 11.

Figure 11:
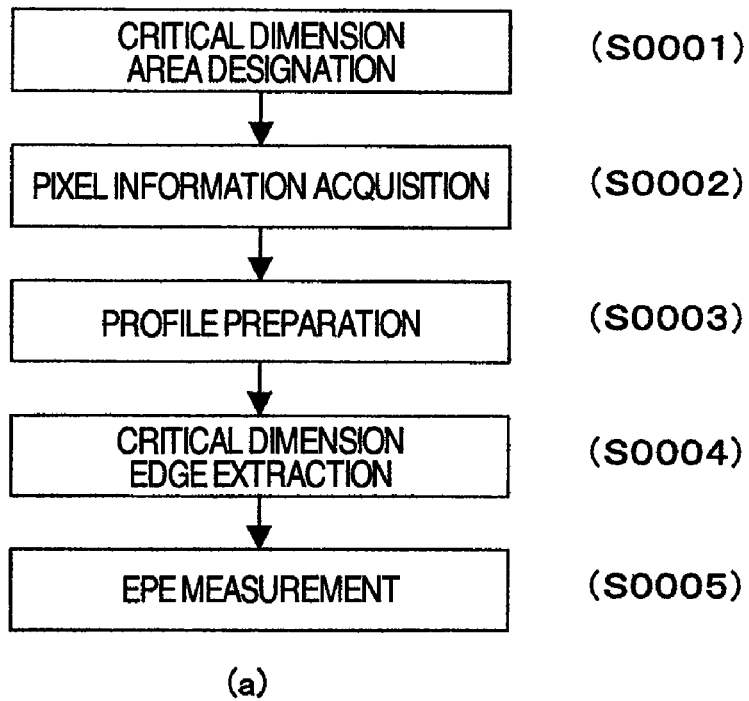
FIG. 11 is a diagram for explaining the flows of FIG. 10 process.
Figure 11:
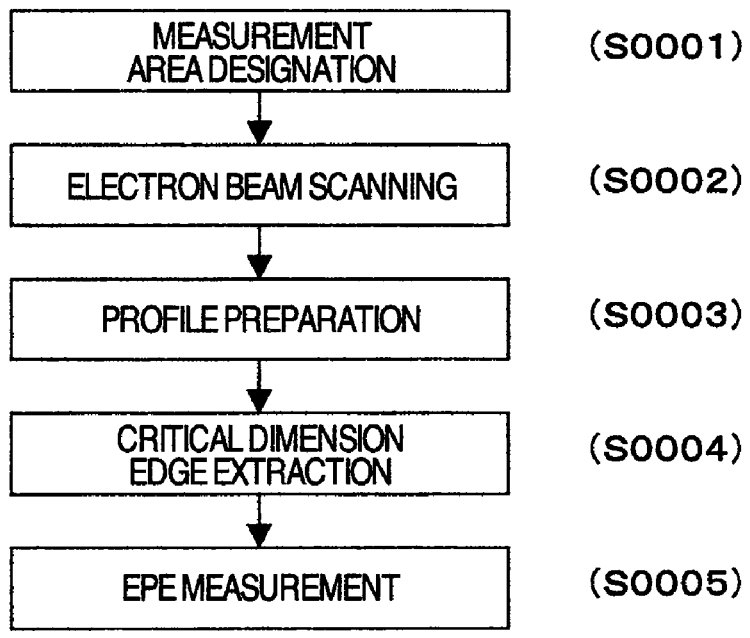

Firstly, an instance where a profile is prepared by using information of pixels inside the critical dimension box 53 is shown at (a) in FIG. 11. Pieces of information of pixels of image data of an inspection objective pattern inside a critical dimension area (S0001) designated by the critical dimension box 53 are acquired (S0002). At that time, it is assumed that the direction of accumulation of the pieces of pixel information is vertical to the edge search direction 57. Next, the pixel information pieces are accumulated and smoothed to create a line profile 54 (S0003). Subsequently, a critical dimension edge 55 is detected from the line profile 54 (S0004). Finally, EPE measurement between a critical dimension edge 55 and the design pattern 40 is carried out (S0005).

Next, an instance where a profile is prepared by scanning an area of critical dimension box 53 with the electron beam is shown at (b) in FIG. 11. The critical dimension area (S0001) designated by the critical dimension box 53 is scanned with the electron beam plural times (S0002). At that time, the scanning direction is assumed to be horizontal to the edge search direction 57. Subsequently, a line profile acquired by scanning the electron beam is prepared (S0003).

Next, a critical dimension edge 55 is detected from the line profile 54 (S0004). Finally, EPE measurement between the critical dimension edge 55 and the design pattern 40 is carried out (S0005).

Illustrated at (a) in FIG. 10 is an example where in the method of image processing such as Sobel filter, a portion of white band 46 of an SEM image at which the brightness is the highest is detected as the SEM edge 45. In this case, the SEM edge 45 is positioned very closely to the critical dimension edge 55 determined through the line profile but it erroneously differs from the critical dimension edge 55 by several nm and lacks accuracy for EPE measurement. Illustrated at (b) in FIG. 10 is an example where in the method of image processing such as Sobel filter, an inner side of the white band 46 is detected as the SEM edge 45. In this case, there is a large error between the SEM edge 45 and the position of critical dimension edge 55.

Illustrated at (c) in FIG. 10 is an example where in the method of image processing such as Sobel filter, an inner edge 58 existing inside the actual pattern 41 is erroneously detected as an SEM edge of the pattern contour and with the inner edge 58 measured erroneously, a correct contour cannot be grasped. In any case shown in FIG. 10, a critical dimension edge 55 having sufficient precision for the EPE measurement can be detected by using the line profile 54.

Figure 12:
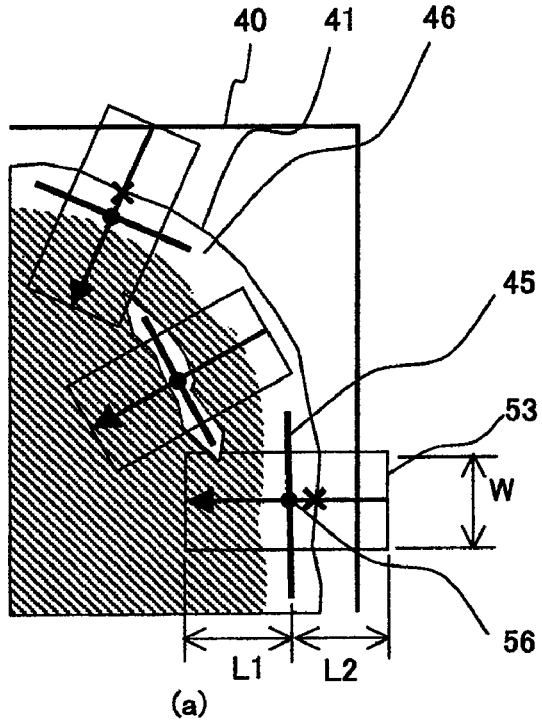
FIG. 12 shows diagrams for explaining a method of arranging critical dimension boxes for preparation of a line profile.
Figure 12:
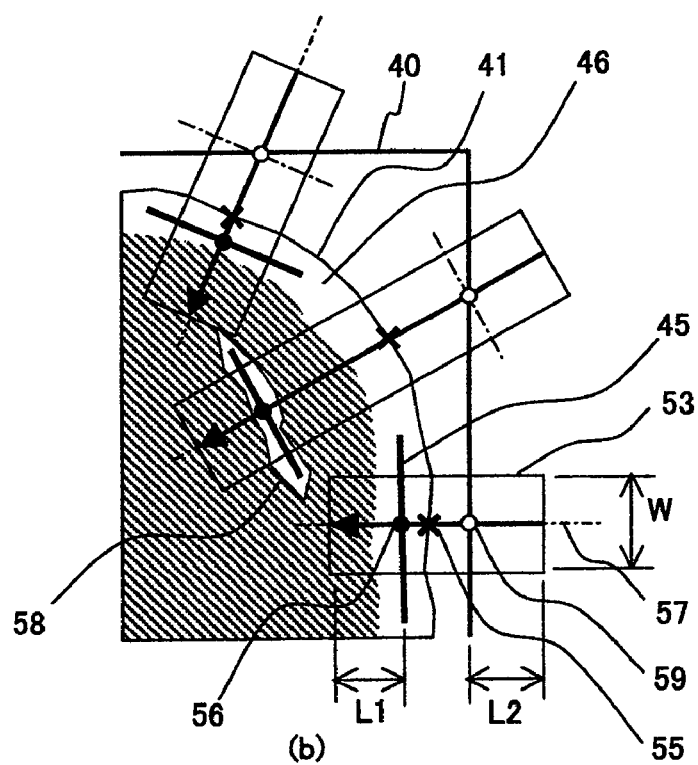

FIG. 12 illustrates examples of a method of placing the critical dimension box 53 indicative of an area for creating the line profile. Illustrated at (a) in FIG. 12 is an instance where the critical dimension box 53 is placed as being referenced to an SEM edge middle point 56 and lengths L1 and L2 of critical dimension box 53 in the edge search direction are set as being referenced to an SEM edge 45.

The lengths L1 and L2 can be settled by setting specified values separately to these lengths, respectively, in expectation of an error in position between the SEM edge 45 and the critical dimension edge 55 but there is the possibility that an error in excess of the expectation will occur when the inner edge 58 is detected erroneously.

In such a case, by making a crossing 59 of the edge search direction 57 and the design pattern 40 a point to which L2 is referenced as shown at (b) in FIG. 12, the critical dimension edge 55 can be grasped correctly. In the example shown at (b) in FIG. 12, the SEM edge 45 exists internally of a figure the design pattern 40 indicates but even in the case of external existence, processing can be executed similarly.

Although not indicated in FIG. 12, a pattern shape estimating the edge search direction 57 and the actual pattern shape through simulation (hereinafter sometimes referred to as a simulation pattern) may be used by making the crossing with the edge search direction 57 a point to which L2 is referenced.

Next, a width W of critical dimension box 53 as shown in FIG. 12 will be described. When the width W of critical dimension box 53 is increased, the number of pieces of image information to be accumulated during preparation of the line profile and the number of secondary electron signal waveforms increase and therefore, with the width W increased excessively, a local shape of a portion at which the shape changes greatly cannot be grasped. Then, the width W may be adjusted automatically in accordance with the length of the SEM edge 45.

For example, by making the width W equal to the length of SEM edge 45, the width W of critical dimension box 53 can be narrowed automatically at a portion where the SEM edge 45 has a short length and changes in shape largely. Further, by setting to the width W upper and lower limit values (for example, an upper limit of 20 nm and a lower limit of 3 nm), the width W can be controlled within a constant range.

Furthermore, in case the profile is formed by scanning the electron beam, the scanning density of the electron beam can be made to be constant by changing the number of lines of scan in accordance with the width W. Through this, such a damage caused by the electron beam as shrinkage of resist can remain intact irrespective of the length of the SEM edge.

Embodiment 4

Figure 13:
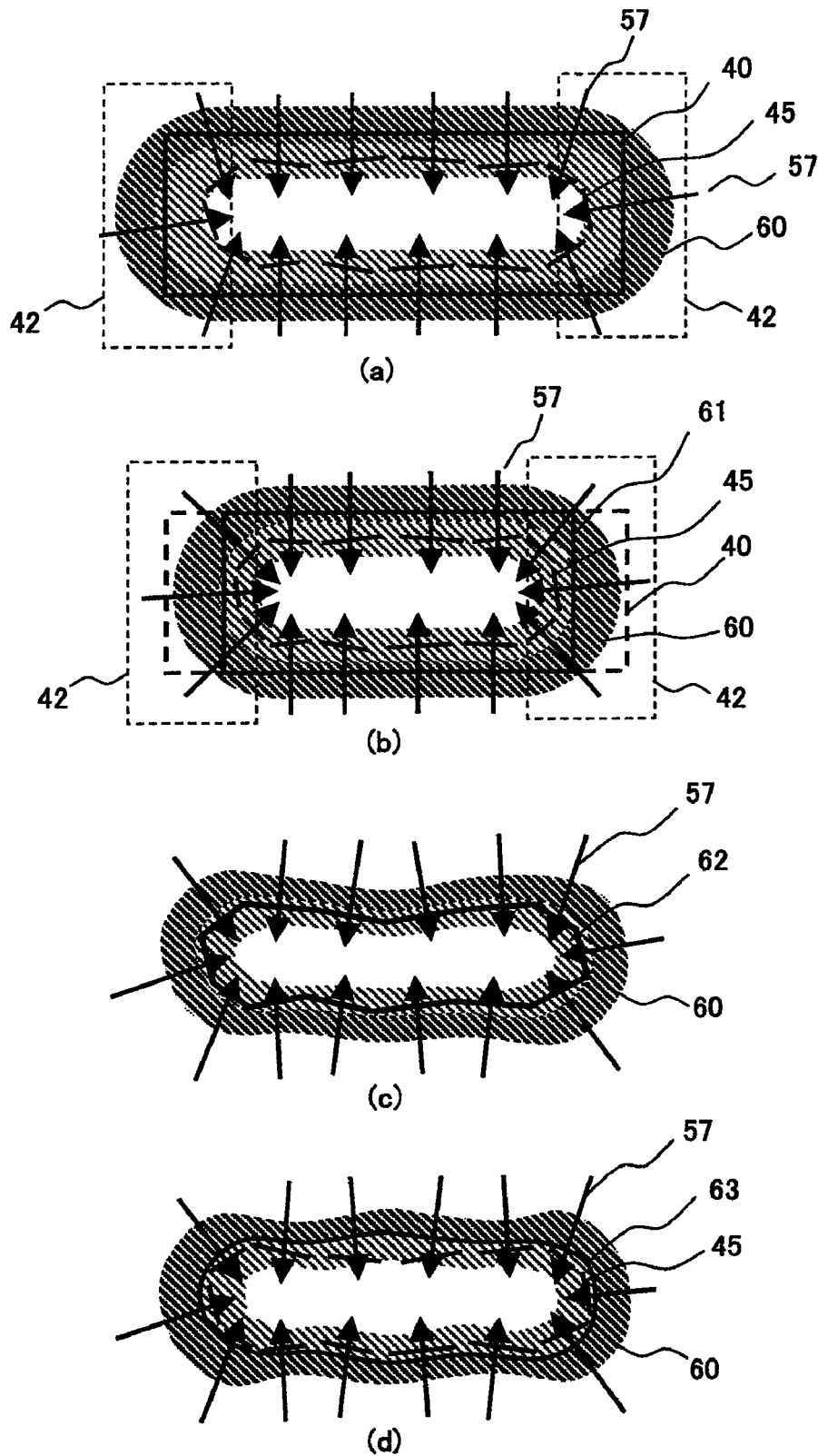
FIG. 13 shows diagrams for explaining directions in which the line profiles are formed.

FIG. 13 is for explaining specified examples of edge search direction 57. Firstly, it is proposed that a direction in which the gradation of a gradation image obtained by painting up a pattern used as a reference and thereafter shading it off by means of, for example, a Gaussian filter changes is set as the edge search direction. For convenience of explanation, the SEM edge is used as the reference position for edge search as explained in connection with FIGS. 10 and 12 but this is not limitative.

Illustrated at (a) in FIG. 13 is an example where the direction in which the gradation of a gradation image 60 prepared by painting up a design pattern 40 and thereafter shading it off with the Gaussian filter changes is set as the edge search direction 57. By using such a method, the edge search direction 57 can be set to a direction vertical to the design pattern 40 in connection with a linear shape portion and at a tip portion 42 and a corner of the pattern, the direction of accumulation of pieces of pixel information and the scanning direction of electron beam can be set in a radial direction commensurate with a change in shape.

Illustrated at (b) in FIG. 13 is an example where a direction in which the gradation of a gradation image 60 prepared by painting up a pattern 61 obtained by deforming the design pattern 40 in expectation of a change in shape of the actual pattern and thereafter shading it off with the Gaussian filter changes is set as the edge search direction 57. In this example, in expectation that the tip portion 42 of the pattern will be shortened, the pattern 61 resulting from deforming the design pattern 40 is prepared. By using this method, in addition to the feature shown at (a) in FIG. 13, the direction of accumulation of pixel information and the scanning direction of electron beam which cope with a local difference in the change amount of pattern shape can be set.

Illustrated at (c) in FIG. 13 is an example where a direction in which the gradation of a gradation image 60 prepared by painting up a polygon 62 connecting the SEM edges and thereafter shading it off with the Gaussian filter changes is set as the edge search direction 57. By using such a method, even in the event that the change amount of shape of the pattern exceeds an estimated level, the accumulation direction of pixel information and the scanning direction of electron beam which cope with a local difference in the amount of change in pattern shape can be set.

Illustrated at (d) in FIG. 13 is an example where a direction in which the gradation of a gradation image 60 prepared by paining up a simulation pattern 63 and thereafter shading it off with the Gaussian filter changes is set as the edge search direction 57. In case the SEM edge exists at a position remote from the simulation pattern, calculation for making the SEM edge 45 commensurate with the simulation pattern 63 becomes complicated. In contrast thereto, by using the gradation image 60 obtained from the simulation pattern 63, the edge search direction 57 can be set easily no matter which position the SEM edge 45 exists at.

In any of the instances at (a), (b), (c) and (d) in FIG. 13, the edge search direction 57 is so set as to direct from the outside to the inside of the pattern to which reference is made but the edge search may be conducted from the inside to the outside. For example, when the edge search is executed from dark to bright of the gradation of gradation image 60, the edge search direction 57 is so set as to be directed from the outside to the inside of a pattern to which reference is made if the pattern referenced to is painted up in color brighter than the background (for example, the background is in black and the inside of the reference pattern is in white). Conversely, when the pattern to be referenced to is painted up in darker than the background (for example, the background is in white and the inside of the reference pattern is in black), the edge search direction 57 can be set from the inside to the outside of the figure to be referenced to.

Embodiment 5

Figure 14:
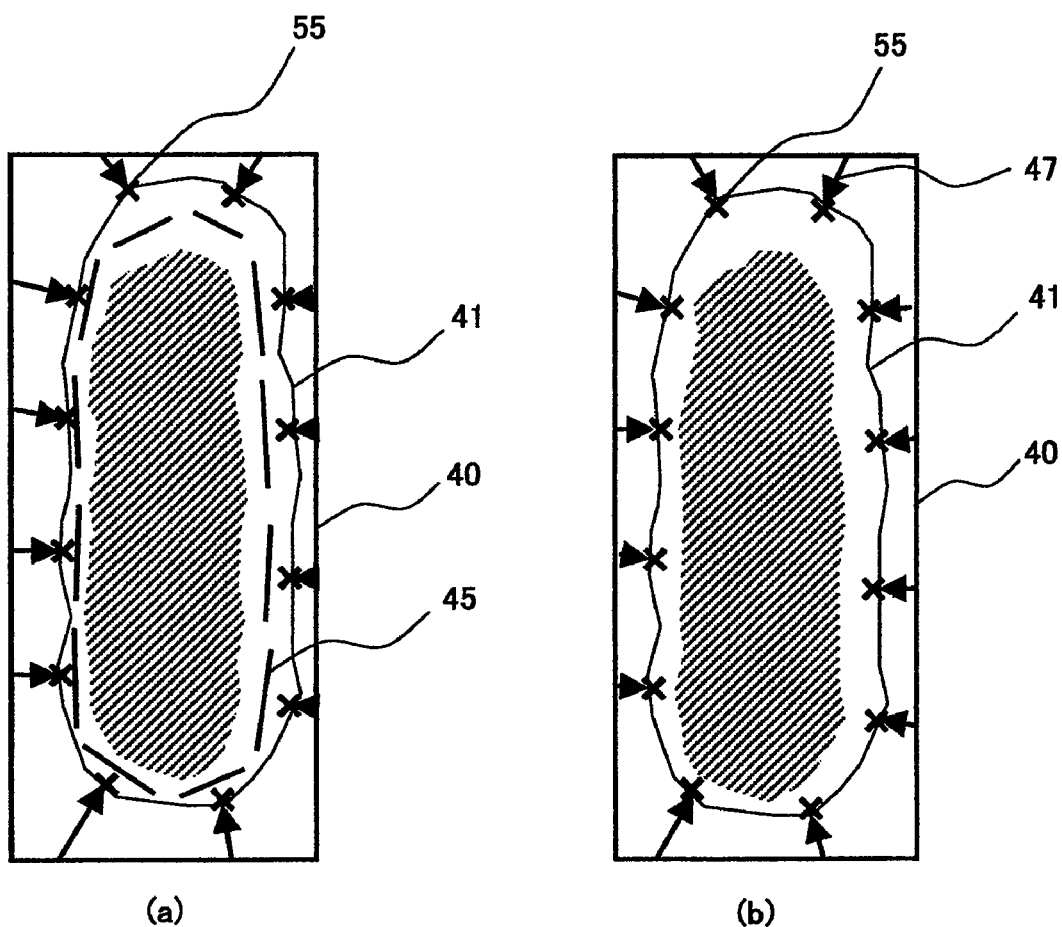
FIG. 14 shows diagrams for explaining results of matching referenced to critical dimension edges in the EPE measurement.

FIG. 14 shows an influence the matching result has upon the EPE measurement values. In order to perform the EPE measurement, the relative positional relation between an SEM image and design data needs to be first settled. Then, through the process explained in connection with FIG. 2, pattern matching is carried out between a template prepared from the design data and an actual pattern.

Figure 15:
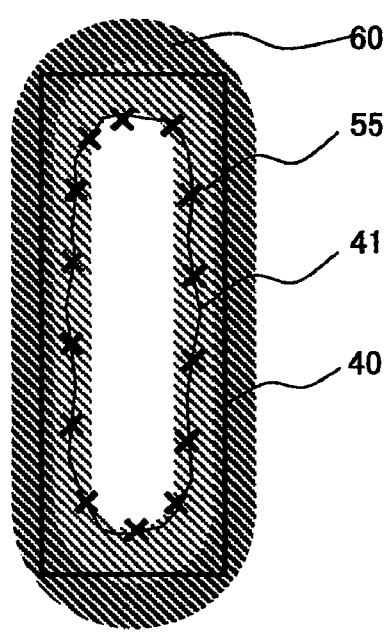
FIG. 15 shows diagrams for explaining methods of pattern matching using the critical dimension edges.
Figure 15:
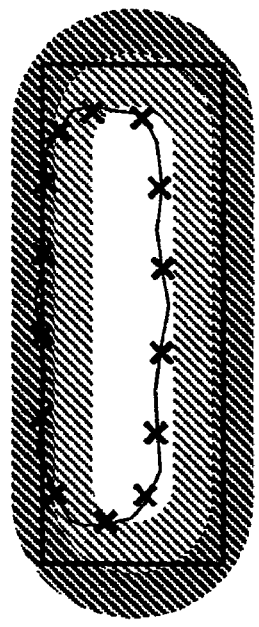
Figure 15:
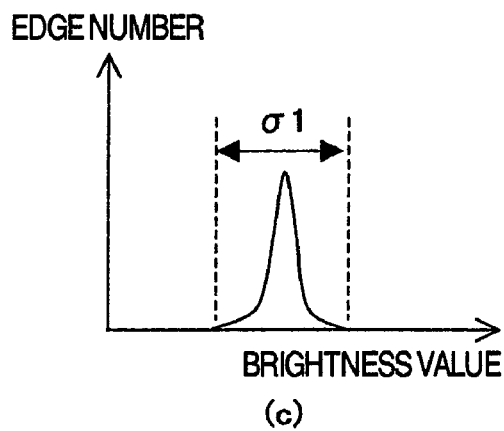
Figure 15:
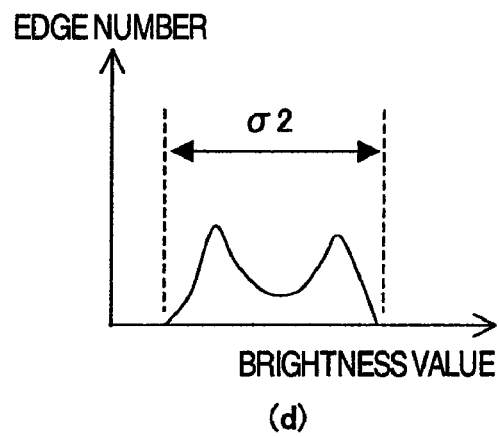

Illustrated at (a) in FIG. 15 is an instance where an SEM edge 45 is used for a process of pattern matching and a critical dimension edge 55 detected by using a line profile is used for EPE measurement. In case a bias occurs in errors in position between the SEM edge 45 used for matching and the critical dimension edge 55 used for the EPE measurement, the critical dimension values by the EPE measurement are also biased and the amount of deformation of the shape of the actual pattern cannot be grasped correctly.

Accordingly, the present invention proposes that the pattern matching using as a reference an edge used during execution of the EPE measurement is carried out.

Illustrated at (b) in FIG. 14 is a specified example where the critical dimension edge 55 is used for both the pattern matching and the EPE measurement. Since the critical dimension edge 55 is used for both the pattern matching and the EPE measurement as shown in this figure, the results of EPE measurement will not be biased if proper pattern matching is executed. The critical dimension edge 55 is used for both the pattern matching and the EPE measurement in the case indicated at (b) in FIG. 14 but similar results can be obtained even by using the SEM edge 45 for both the pattern matching and the EPE measurement.

Embodiment 6

Figure 16:
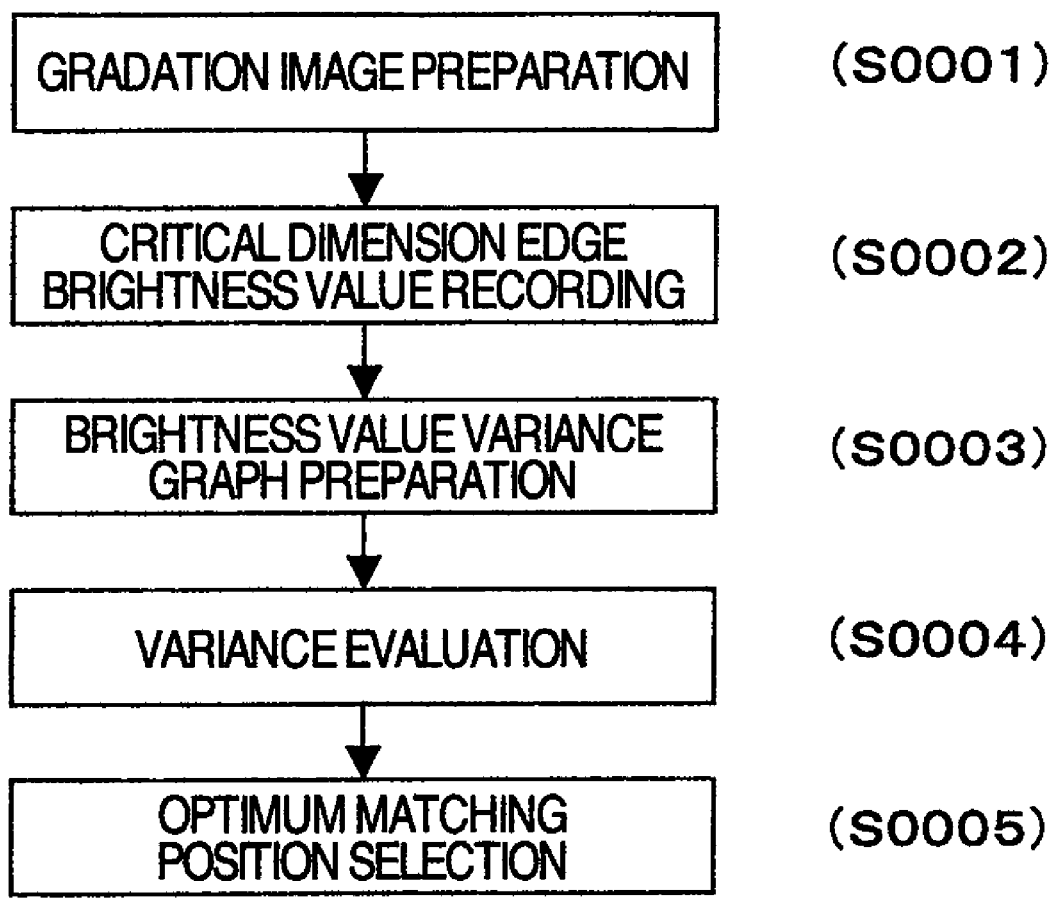
FIG. 16 is a diagram for explaining the flow of the process of FIG. 15.

By using FIGS. 15 and 16, a specified embodiment of pattern matching using the critical dimension edge 55 will be described. Firstly, a gradation image of actual pattern 41 and a reference pattern (in the case of FIG. 15, a design pattern 40) with which the actual pattern is to be pattern-matched is prepared (S0001). Next, brightness values of the gradation image at individual positions of critical dimension edges 55 are recorded (S0002) and put together into a graph as shown at (c) in FIG. 15 (S0003). This graph is one for showing a variance of the number of edges with abscissa representing brightness value.

When the result of pattern matching shows an ideal position as shown at (a) in FIG. 15, dispersions of brightness values of gradation image 60 at positions of individual critical dimension edges 55 are small and the graph exhibits a small variance σ1 as shown at (c) in FIG. 15. Conversely, when the results of pattern matching are biased as shown at (b) in FIG. 15, brightness values of gradation image 60 at the positions of individual critical dimension edges 55 disperse and as a result, the graph exhibits a large variance σ2 as shown at (d) in FIG. 15. By taking advantage of the principle as above, the variance of brightness values is evaluated (S0004) and positions at which the variance is minimized are selected as optimum matching positions (S0005).

As described above, by evaluating the variance of brightness values of a gradation image of a reference pattern subject to pattern matching at the individual critical dimension edge positions, ideal pattern matching can be achieved. While in FIG. 15 the design data 40 is used as the reference pattern, the design pattern or simulation pattern reflecting the shape change estimation as explained in connection with FIG. 13 may be used. Further, the critical dimension edge 55 is used for pattern matching in FIG. 15 but alternatively, the SEM edge may be used.

Embodiment 7

In addition, a method of correcting a rotational component during pattern matching will be described in detail. In the EPE measurement, accuracies of sub-nanometer are demanded and unless accurate pattern matching is carried out, the error in EPE measurement value increases. Especially, the pattern matching error of rotational component in a linear pattern as shown at (a) in FIG. 17 causes a large error in the EPE measurement value. To solve this problem, matching inclusive of correction of the error in rotational component needs to be carried out.

Figure 17:
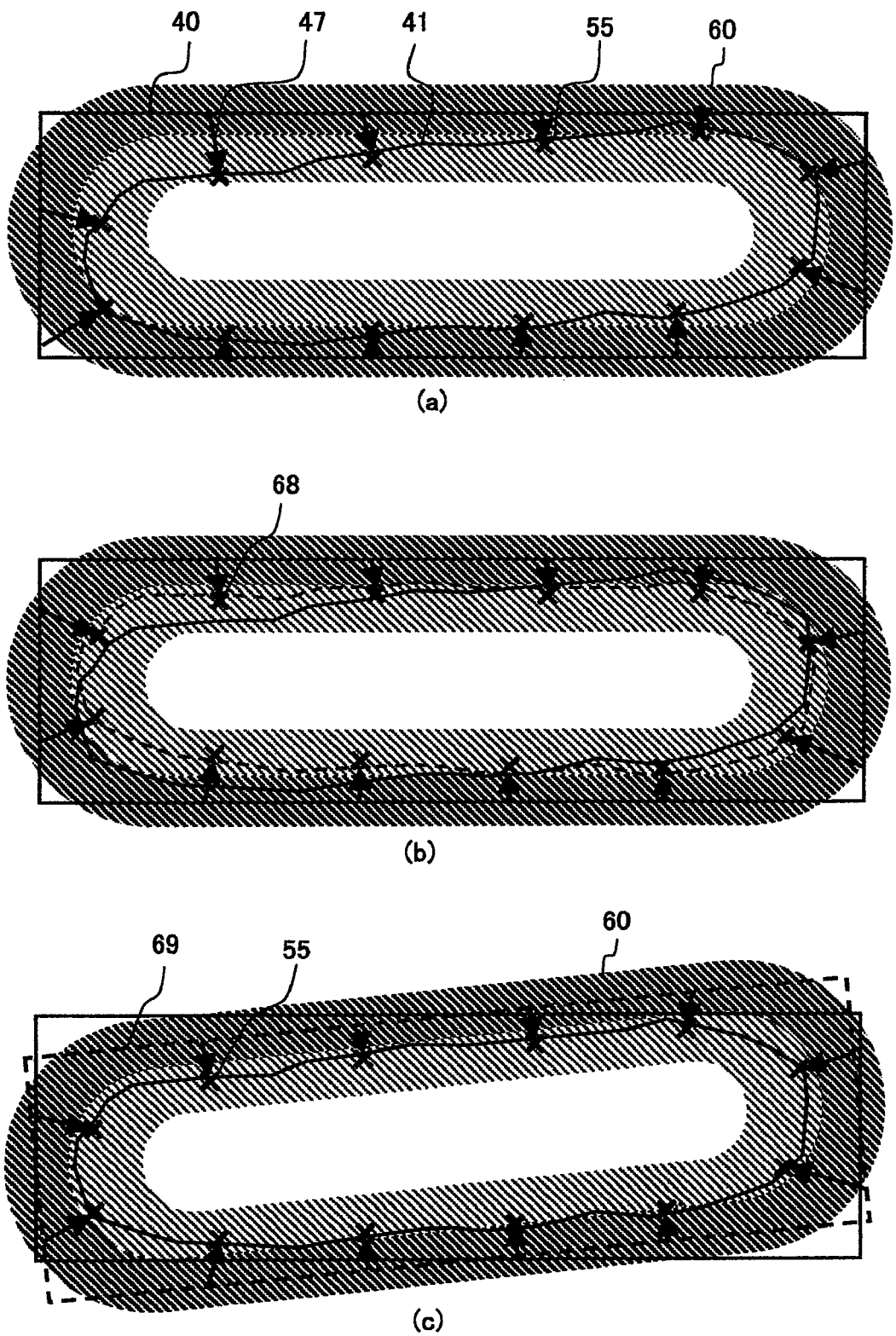
FIG. 17 shows diagrams for explaining a method of correcting rotational components in the EPE measurement.

The present example proposes, for the sake of correcting the rotational component, 1) a method of rotating the position (coordinates) of an edge used for EPE measurement ((b) in FIG. 17) and 2) a method of rotating the position (coordinates) of a pattern to which pattern matching is referenced is rotated ((c) in FIG. 17).

Figure 18:
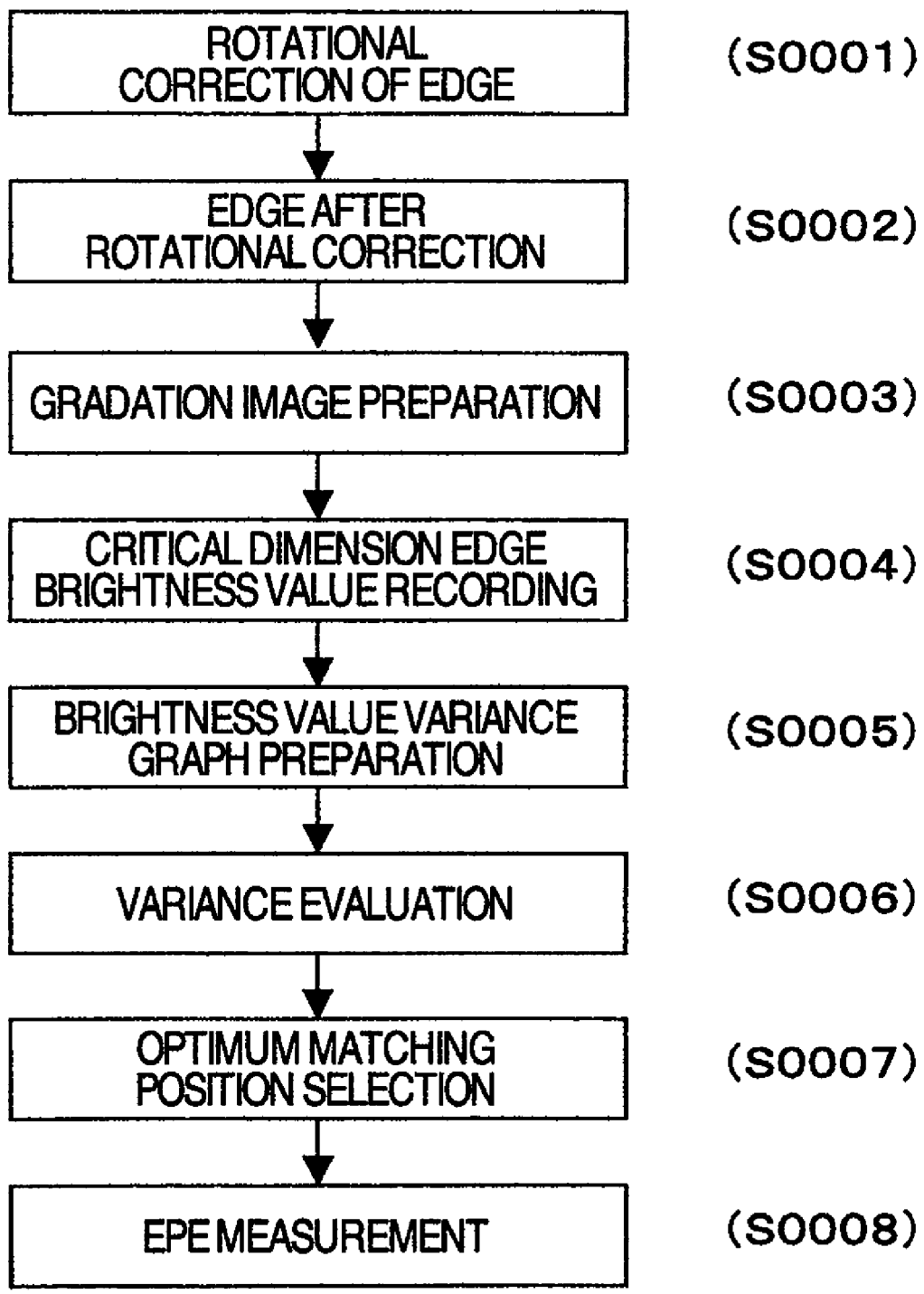
FIG. 18 is a diagram-1 for explaining the process flow of FIG. 17.

1) The method of rotating the position of an edge used for EPE measurement will be described in detail by making reference to (b) in FIG. 17 and FIG. 18. As shown at (b) in FIG. 17, coordinates (X1, Y1) of a critical dimension edge 55 detected under a condition not subjected to rotation (condition at (a) in FIG. 17) is corrected for rotation by angle θ by using equation of rotation as shown in equation (3) (S0001) and coordinates (X2, Y2) of a critical dimension edge 68 after rotation correction is obtained (S0002).

$$\begin{pmatrix} X2 \\ Y2 \end{pmatrix} = \begin{pmatrix} \cos\theta & \sin\theta \\ -\sin\theta & \cos\theta \end{pmatrix} \begin{pmatrix} X1 \\ Y1 \end{pmatrix} \quad (3)$$

Next, a variance of brightness values of individual critical dimension edges 68 after rotation correction is evaluated by using the method explained in connection with FIG. 15 (S0003~S0006) and a position for optimum pattern matching is introduced (S0007). After the optimum matching result is obtained, EPE measurement between the critical dimension edge 68 after rotation correction and the reference pattern (here design pattern 40) is carried out (S0008). Here, selection of the optimum matching position effected by utilizing the rotation correction and its result is carried out once but in order to raise the accuracy further, the process may be repeated several times.

Figure 19:
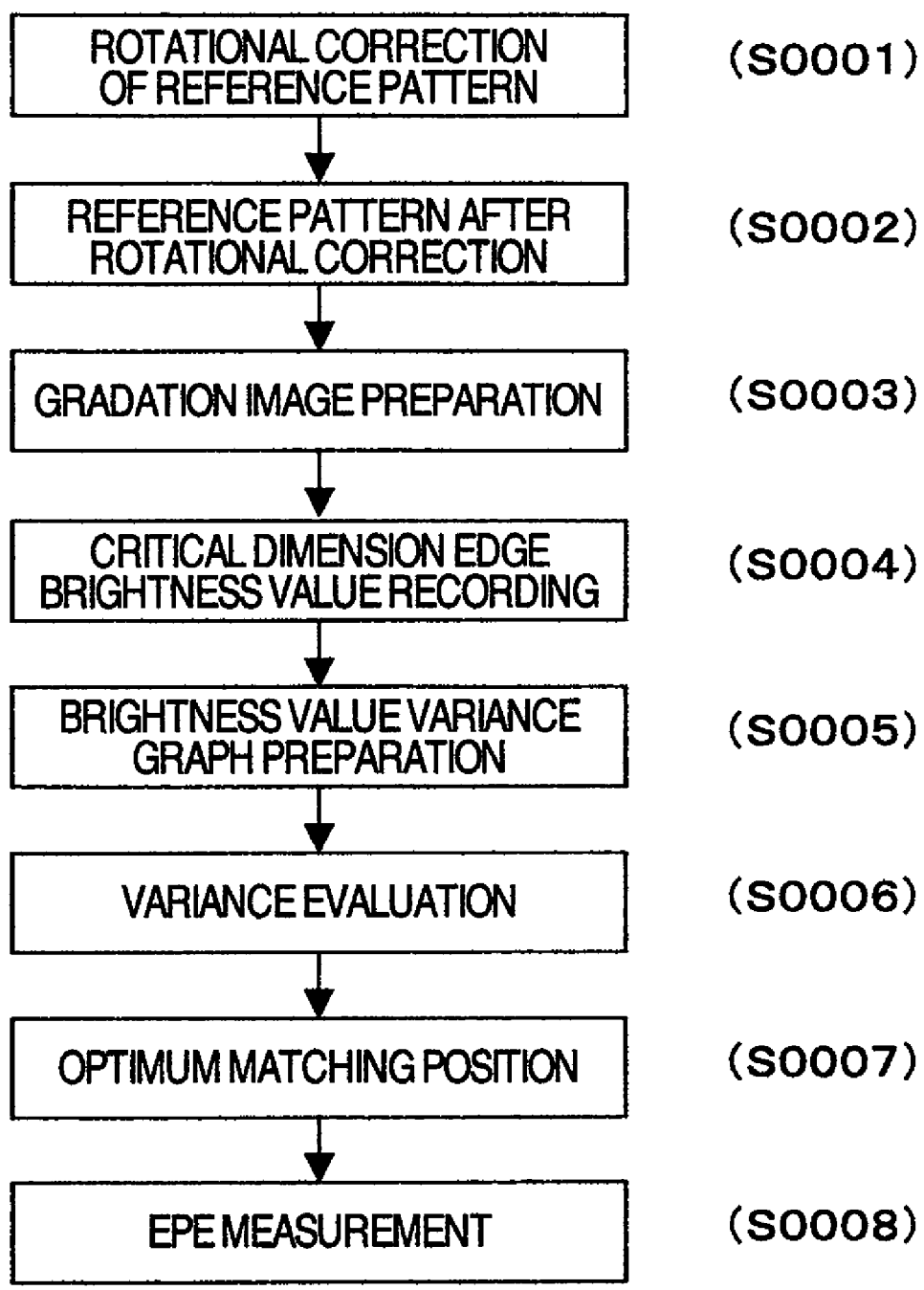
FIG. 19 is a diagram-2 for explaining the process flow of FIG. 17.

2) The method of rotating the position of a pattern to which pattern matching is referenced will be described in detail by making reference to (c) in FIG. 17 and FIG. 19.

As shown at (c) in FIG. 17, coordinates of apices of a reference pattern (here design pattern 40) are rotated for correction by angle θ using the rotation expression as indicated by equation (3) (S0001) and a pattern of reference after rotation correction (here design pattern 69 after rotation correction) is obtained (S0002).

Next, by using the reference pattern subjected to rotational correction, the variance of brightness values of the individual critical dimensions 55 is evaluated pursuant to the method explained in connection with FIG. 15 (S0003~S0006) and an optimum pattern matching position is introduced (S0007). After the result of optimum matching is obtained, EPE measurement between the critical dimension edge 55 and the reference pattern subject to rotational correction (here, design pattern 69 subject to rotational correction) is carried out (S0008).

The top feature of the methods of above 1) and 2) proposed in the present example resides in that the image data is not rotated and yet coordinate data is rotated. This ensures that fast processing can be executed and besides the error in EPE measurement accuracy attributable to errors in rounding pixels caused during rotation of the image data can be prevented from occurring.

Embodiment 8

Figure 20:
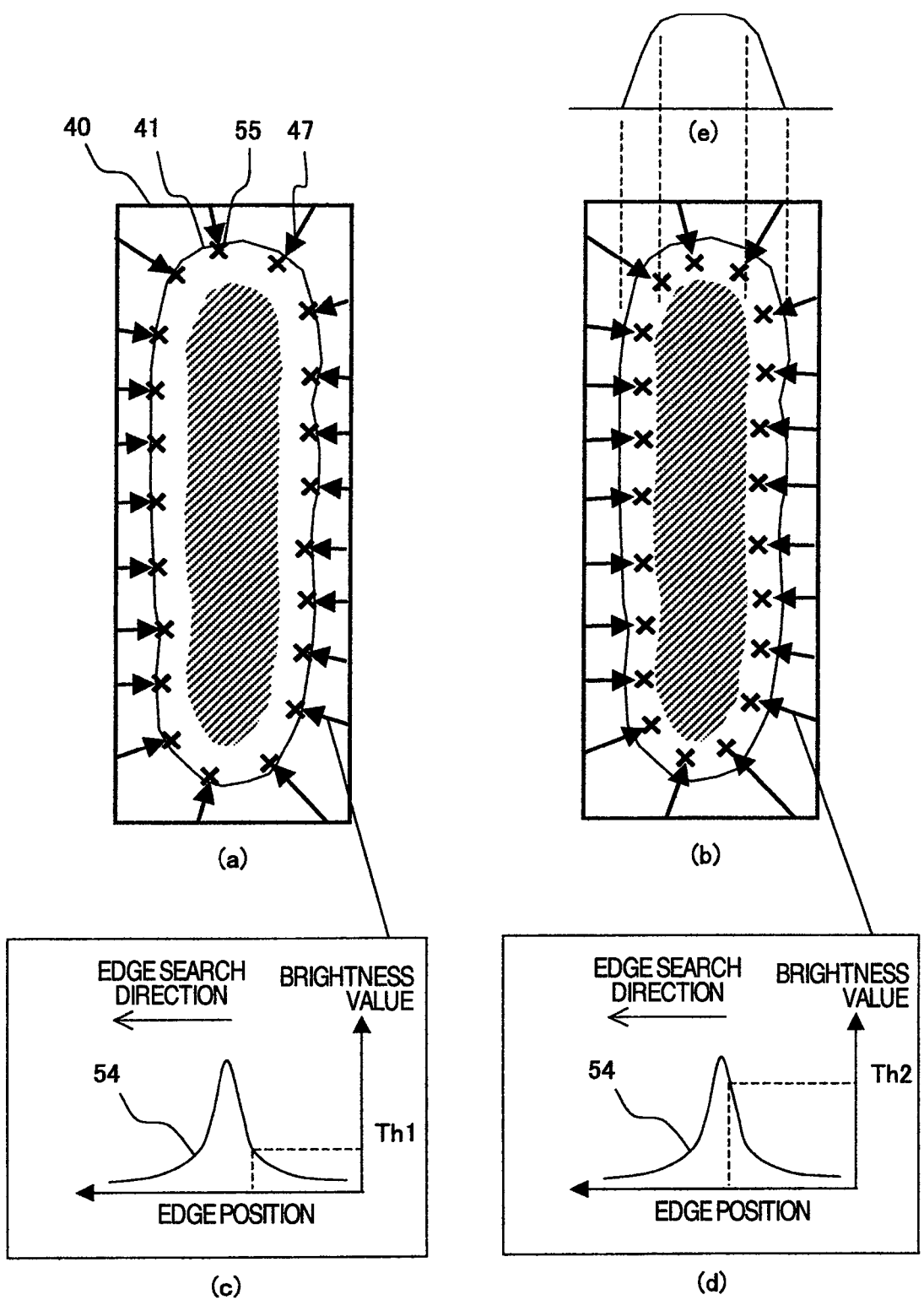
FIG. 20 is a diagram for explaining edge extraction positions when the threshold for detection of critical dimension edge is changed.

FIG. 20 is for explaining a method of obtaining cubical shape information of actual pattern 41 by changing the threshold at the time that a critical dimension edge 55 is detected through the use of a line profile 54.

Illustrated at (a) and (b) in FIG. 20 are each the EPE measurement 47 of an actual pattern 41 having a sectional shape as shown at (e) in FIG. 20. When a threshold Th1 is set to the brightness value of line profile 54 as shown at (c) in FIG. 20, EPE measurement 47 using an SEM edge 55 is indicated as shown at (a) in FIG. 20. Contrary to this, when a threshold Th2 larger than the threshold Th1 is set to the brightness value of line profile 54 as shown at (d) in FIG. 20, EPE measurement 47 using an SEM edge 55 is indicated as shown at (b) in FIG. 20.

As will be seen from comparison of the EPE measurement 47 at (a) in FIG. 20 with that at (b) in FIG. 20, contours at different heights of the actual pattern 41 can be grasped by changing the threshold during determination of the SEM edge 55 from the line profile 54. By using the information as above, the EPE measurement of the amount of cubical shape deformation of actual pattern 41 can be achieved. To add, only the two kinds of thresholds are used in this example but in the case of acquisition of more detailed cubical shape information, the threshold may be graded more finely in, for example, 10 steps.

Embodiment 9

Figure 21:
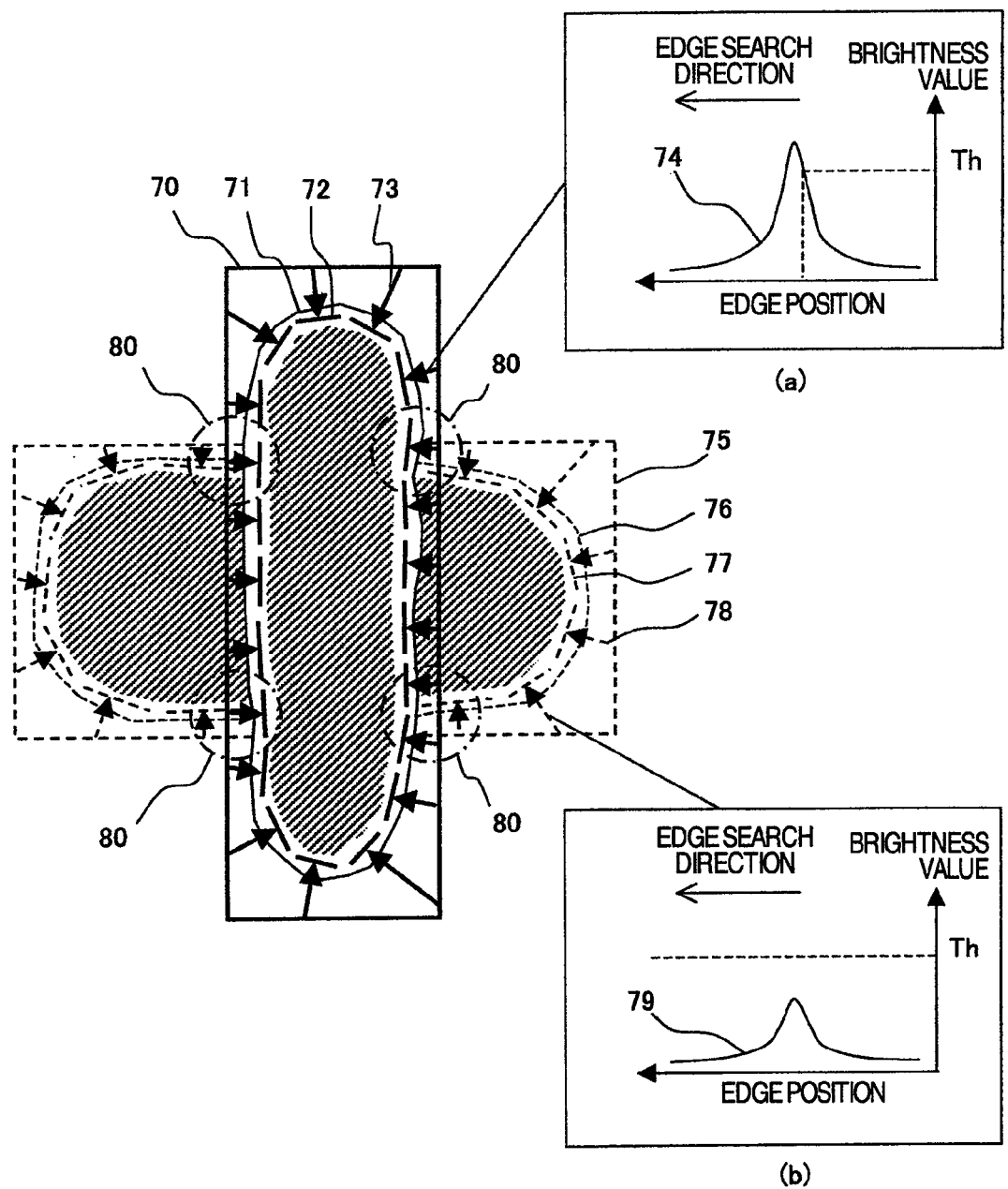
FIG. 21 is a diagram-1 for giving an explanation of the EPE measurement of a pattern of plural layers.

The EPE measurement adapted for the case where a semiconductor device is formed going through a plurality of layers will be described by using FIG. 21. FIG. 21 illustrates a semiconductor device to be observed through an SEM image has two layers of upper and lower layers but the existence of three or more layers may be involved.

In a method for discriminating the EPE measurement of an upper layer from that of a lower layer, for an SEM edge extracted from an actual pattern, layer information of a design pattern with which the SEM edge is correspondent can be used.

FIG. 21 shows an example where an SEM edge is made to be correspondent with a reference pattern lying in a direction vertical to the SEM edge (here, a design pattern). As shown in FIG. 21, an upper layer SEM edge 72 can be correspondent with an upper layer design pattern 70 and a lower SEM edge 77 can be correspondent with a lower layer design pattern 75.

But, there is the possibility that the correspondence will become ambiguous at a portion 80 where an edge of the upper layer pattern overlaps that of the lower layer.

Then, in the present example, a method will be proposed which sorts SEM edges according to individual layers by utilizing the difference in shape of a line profile prepared at individual positions of the SEM edges.

Illustrated at (a) in FIG. 21 is a line profile 74 of an upper layer pattern edge and at (b) in FIG. 21 is a line profile 79 of a lower layer pattern edge. In this example, the brightness value of the line profile 79 of lower layer pattern edge is so exemplified as to be lower than that of the line profile 74 of upper layer pattern edge. In such a case, by setting a suitable threshold to the brightness value, the upper layer SEM edge 72 can be discriminated from the lower layer SEM edge 77.

Figure 22:
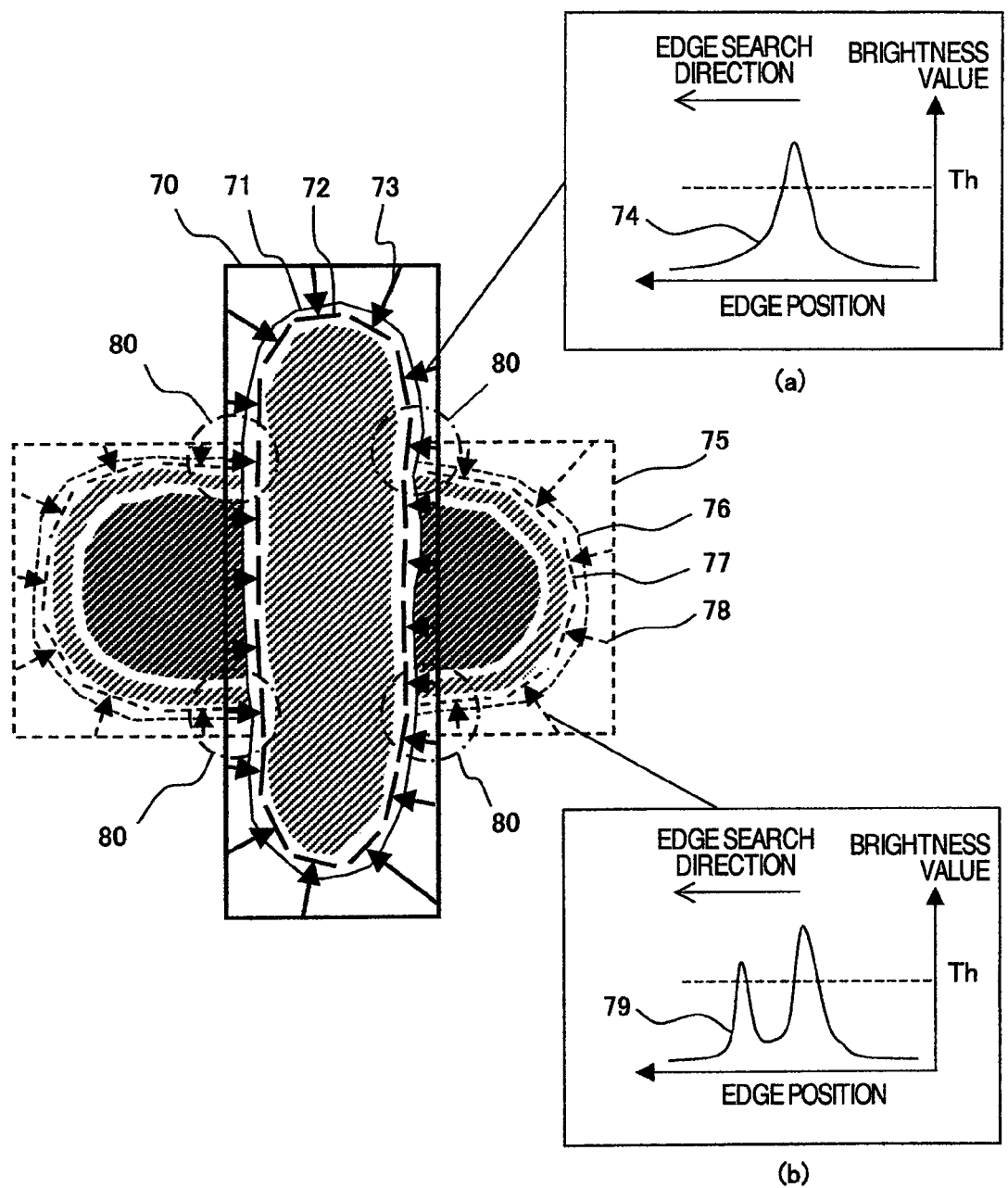
FIG. 22 is a diagram-2 for giving an explanation of the EPE measurement of a pattern of plural layers.

Further, like FIG. 21, FIG. 22 shows at (a) a line profile 74 of an upper layer pattern edge and at (b) a line profile 79 of a lower layer pattern edge. In this example, the brightness value of the upper layer line profile 74 has one peak whereas the brightness value of the lower layer line profile 79 has two peaks. In such a case, by examining the number of peaks in excess of an appropriate threshold Th set to the brightness value, the upper SEM edge 72 can be discriminated from the lower SEM edge 77.

While in FIGS. 21 and 22 the difference in shape of line profile is determined by the threshold set to the line profile, the method for comparison of line profile shapes is not limited thereto. For example, line profile shapes per se may be compared to each other through normalized correlation.

Embodiment 10

FIG. 23 shows an example of the output result of EPE measurement result. As shown in the figure, the output result includes 1) information 92 concerning the EPE measurement result, 2) information 93 of a reference pattern to which the EPE measurement is referenced and 3) results of evaluation of the EPE measurement.

An EPE measurement information item contains measurement value of the EPE measurement, coordinates of a critical dimension edge from which the measurement value originates and coordinates of a correspondent reference pattern. A reference pattern information item contains the type of reference pattern (design pattern, simulation pattern or the like), layer information of the reference pattern (layer information, data type) and figure information (figure number, line segment number, line segment start point/end point coordinates, line segment direction). An evaluation result item contains sorting information of portions of a reference pattern made to be correspondent to during EPE measurement (linear portion, corner portion, tip portion and the like), standards of managing EPE measurement value (such as threshold for abnormality decision and so on) and importance degree of EPE measurement value (within specifications, outside specifications, fatal or not fatal).

The sorting information of reference pattern will sometimes be contained in the reference pattern information. For example, when a specified layer number or data type is set to a figure collecting only Line portions, the reference pattern can be sorted by consulting it. Alternatively, the shape of reference pattern may be analyzed to prepare sorting information automatically. For example, it is possible that a line segment having a length exceeding a constant value is deemed as a linear portion, a portion remote by a constant distance from a portion at which line segments cross at right angles is deemed as a corner and a portion where two corners approach mutually and a linear portion having a length longer than a constant value connects is deemed as a tip portion.

Furthermore, the managing standards can be set independently according to sorting of the reference pattern. For example, the managing standards for the corner portion can be mitigated as compared to those for the linear portion. Further, for the same linear portion, the managing standards may be set discriminatively on conditions (for example, the degree of importance a semiconductor circuit has). In the example of FIG. 23, the managing standards are set to −1.0~1.0 nm in connection with a linear portion (Line-1) for which the standards are stringent, the managing standards are set to −3.0~3.0 nm in connection with a linear portion (Line-2) for which the standards are tolerant and the managing standards are set to −15.0~5.0 nm in connection with a corner for which the standards are more tolerant than those for the linear portion.

In this manner, by storing various kinds of information having the relation to the EPE measurement in tabular form and by discriminatively displaying EPE measurement values in excess of the set managing standards to make them discernible from other measurement results, a pattern to be reevaluated may be clarified. In the case of the example of FIG. 23, by displaying a predetermined number or mark indicative of abnormality in an entry of importance categorized in the item of evaluation result of the EPE measurement, other measurement results are displayed discriminatively. More particularly, in the case of the EPE number 2, the EPE measurement value is −5.3 nm in relation to the managing standard lower limit −3.0 nm, indicating that the managing standards are exceeded, and therefore the degree of importance is set to 2 that is problematic. With this structure, the custodian can selectively evaluate only a portion exceeding the tolerable error and the efficiency of evaluation can be improved to advantage.

In addition, although not shown in FIG. 23, EPE measurement values in individual different directions are averaged to obtain mean values and the means EPE values in the individual directions are examined as to whether to be biased, so that it can be decided whether either an actual pattern is displaced as a whole or only a part of the actual pattern is deformed in relation to a reference pattern. In other words, if only a part of the EPE measurement value is large, it is conceivable that only the area is deformed for any reasons. But, for example, if a mean EPE measurement value in a direction is largely minus and a mean EPE measurement value in the opposite direction is largely plus, there is the possibility that the pattern will be so formed as to make a large displacement in that direction.

The invention claimed is:

1. In a method of measuring a pattern by specifying the position of a pattern edge of an inspection objective pattern by using a signal waveform acquired by scanning a charged-particle beam on a sample so as to measure a distance between design data of said inspection objective pattern and said pattern edge,
a pattern inspecting/measuring method comprising: measuring a pattern edge direction of said inspection objective pattern, measuring a relative angle the scanning direction of said charged-particle beam makes to the pattern edge direction of said inspection objective pattern, estimating a distortion of said signal waveform attributable to said relative angle and correcting said estimated distortion of signal waveform, whereby a pattern edge position is specified from said corrected signal waveform.

2. A pattern inspecting/measuring method according to claim 1 comprising: preparing, from image data of said objective pattern acquired by scanning said charged-particle beam in a constant direction, said signal waveform as a line profile, estimating a distortion of said line profile from a relative angle the scanning direction of said charged-particle beam makes to a pattern edge of said inspection objective pattern and correcting a distortion of said estimated line profile, whereby a pattern edge position is specified from said corrected line profile.

3. In a method of measuring a pattern by specifying the position of a pattern edge of an inspection objective pattern by using a signal waveform acquired by scanning a charged-particle beam on a sample so as to measure a distance between design data of said inspection objective pattern and said pattern edge,
a pattern inspecting/measuring method comprising: measuring the direction of a pattern edge of said inspection objective pattern to change the scanning direction of the charged-particle beam in accordance with a measured pattern edge direction.

4. In a method of measuring a pattern by specifying the position of a pattern edge of an inspection objective pattern by using a signal waveform acquired by scanning a charged-particle beam on a sample so as to measure a distance between design data of said inspection objective pattern and said pattern edge,
a pattern inspecting/measuring method comprising changing the scanning direction of said charged-particle beam in accordance with the direction of a change of gradation a gradation image of design data of said inspection objective pattern exhibits at a scanning position.

5. A pattern inspecting/measuring method according to claim 3 or 4 comprising: measuring errors in the scanning position and direction of said charged-particle beam and estimating, from measured errors, errors in the scanning position and direction of said charged-particle beam at an arbitrary position and in an arbitrary direction, whereby the estimated errors in the scanning position and direction are corrected in advance so as to permit said charged-particle beam to scan at a correct position and in a correct direction.

6. An inspecting/measuring method according to claim 3 or 4, wherein the charged-particle beam is caused to selectively scan only a position of measurement of a pattern edge of said inspection objective pattern.

7. A pattern inspecting/measuring method according to claim 1, wherein a pattern edge specified from said signal waveform is formed into one figure on the basis of design data of said inspection objective pattern.

8. A pattern inspecting/measuring method according to claim 1, wherein a plurality of candidates for positions of pattern edges of said inspection objective pattern are selected from said signal waveform and stored and when forming one figure on the basis of design data of said inspection objective pattern, appropriate pattern edge positions are selected from said plurality of pattern edge candidates.

9. A pattern inspecting/measuring method according to claim 1 comprising: matching design data of said inspection objective pattern with a pattern by using the pattern edge position of inspection objective pattern specified from said signal waveform, whereby coordinates of the pattern edge position of inspection objective pattern specified from said signal waveform is corrected in accordance with the result of pattern matching.

10. A pattern inspecting/measuring method according to claim 1, wherein when specifying the pattern edge position of inspection objective pattern from said signal waveform, information about a change in cubical shape of said inspection objective pattern is measured by changing the condition for specifying.

11. A pattern inspecting/measuring method according to claim 1, wherein the pattern edges of said inspection objective pattern are classified by using features of shape of said signal waveform.

12. An arithmetic unit for measuring the dimension of a pattern on a sample on the basis of an image obtained under scanning a charged-particle beam emitted from a charged-particle source on said sample, wherein said arithmetic apparatus calculates a direction of a pattern edge formed on said sample and a relative angle the scanning direction of said charged-particle beam makes to the edge direction of the pattern, a signal waveform detected from said pattern edge is corrected on the basis of a distortion corresponding to the calculated relative angle and the dimension of said pattern is measured on the basis of the corrected signal waveform.

13. An arithmetic unit according to claim 12, wherein said arithmetic apparatus measures a dimension between design data of said pattern and a pattern edge on said image.

* * * * *